United States Patent
Harari et al.

(10) Patent No.: US 7,834,392 B2
(45) Date of Patent: Nov. 16, 2010

(54) MULTI-STATE NON-VOLATILE INTEGRATED CIRCUIT MEMORY SYSTEMS THAT EMPLOY DIELECTRIC STORAGE ELEMENTS

(75) Inventors: Eliyahou Harari, Saratoga, CA (US); George Samachisa, San Jose, CA (US); Jack H. Yuan, Cupertino, CA (US); Daniel C. Guterman, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 12/510,077

(22) Filed: Jul. 27, 2009

(65) Prior Publication Data

US 2009/0286370 A1  Nov. 19, 2009

Related U.S. Application Data

(60) Continuation of application No. 12/020,296, filed on Jan. 25, 2008, now Pat. No. 7,579,247, which is a continuation of application No. 11/075,427, filed on Mar. 7, 2005, now Pat. No. 7,341,918, which is a division of application No. 10/280,352, filed on Oct. 25, 2002, now Pat. No. 6,925,007, which is a continuation-in-part of application No. 10/161,235, filed on May 31, 2002, now abandoned, which is a continuation-in-part of application No. 10/002,696, filed on Oct. 31, 2001, now Pat. No. 6,897,522.

(51) Int. Cl.
H01L 29/792 (2006.01)
(52) U.S. Cl. ............... 257/324; 257/326; 257/E29.309
(58) Field of Classification Search ................. 438/947, 438/954
See application file for complete search history.

(56) References Cited

U.S. PATENT DOCUMENTS 3,979,582 A    9/1976 Mims (Continued)

FOREIGN PATENT DOCUMENTS

EP    1 073 120 A2    1/2001

(Continued)

OTHER PUBLICATIONS

Aritome, Seiichi, et al., "A Novel Side-Wall Transfer-Transistor Cell (Swatt Cell) for Multi-Level NAND EEProms", 1995 IEEE International Solid-State Circuits Conference, IEDM 95, pp. 275-278.

(Continued)

*Primary Examiner*—Stephen W Smoot
(74) *Attorney, Agent, or Firm*—Davis Wright Tremain LLP

(57) ABSTRACT

Non-volatile memory cells store a level of charge corresponding to the data being stored in a dielectric material storage element that is sandwiched between a control gate and the semiconductor substrate surface over channel regions of the memory cells. More than two memory states are provided by one of more than two levels of charge being stored in a common region of the dielectric material. More than one such common region may be included in each cell. In one form, two such regions are provided adjacent source and drain diffusions in a cell that also includes a select transistor positioned between them. In another form, NAND arrays of strings of memory cells store charge in regions of a dielectric layer sandwiched between word lines and the semiconductor substrate.

14 Claims, 17 Drawing Sheets

U.S. PATENT DOCUMENTS

| | | |
|---|---|---|
| 4,057,788 A | 11/1977 | Sage |
| 4,112,507 A | 9/1978 | White et al. |
| 4,173,766 A | 11/1979 | Hayes |
| 4,398,248 A | 8/1983 | Hsia et al. |
| 4,527,257 A | 7/1985 | Cricchi |
| 4,622,656 A | 11/1986 | Kamiya et al. |
| 4,870,470 A | 9/1989 | Bass, Jr. et al. |
| 5,043,940 A | 8/1991 | Harari |
| 5,070,032 A | 12/1991 | Yuan et al. |
| 5,095,344 A | 3/1992 | Harari |
| 5,168,334 A | 12/1992 | Mitchell et al. |
| 5,172,338 A | 12/1992 | Mehrotra et al. |
| 5,172,338 A | 12/1992 | Mehrotra et al. |
| 5,198,996 A | 3/1993 | Kojima et al. |
| 5,278,439 A | 1/1994 | Ma et al. |
| 5,311,049 A | 5/1994 | Tsuruta |
| 5,313,421 A | 5/1994 | Guterman et al. |
| 5,315,541 A | 5/1994 | Harari et al. |
| 5,343,063 A | 8/1994 | Yuan et al. |
| 5,424,978 A | 6/1995 | Wada et al. |
| 5,426,605 A | 6/1995 | Van Berkel et al. |
| 5,436,481 A | 7/1995 | Egawa et al. |
| 5,440,505 A | 8/1995 | Fazio et al. |
| 5,539,690 A | 7/1996 | Talreja et al. |
| 5,661,053 A | 8/1997 | Yuan |
| 5,705,415 A | 1/1998 | Orlowski et al. |
| 5,712,180 A | 1/1998 | Guterman et al. |
| 5,768,192 A | 6/1998 | Eitan |
| 5,824,584 A | 10/1998 | Chen et al. |
| 5,851,881 A | 12/1998 | Lin et al. |
| 5,887,145 A | 3/1999 | Harari et al. |
| 5,889,303 A | 3/1999 | Eckert et al. |
| 5,912,844 A | 6/1999 | Chen et al. |
| 5,942,787 A | 8/1999 | Gardner et al. |
| 5,946,231 A | 8/1999 | Endoh et al. |
| 5,969,383 A | 10/1999 | Chang et al. |
| 6,010,934 A | 1/2000 | Wu |
| 6,011,725 A | 1/2000 | Eitan |
| 6,030,871 A | 2/2000 | Eitan |
| 6,046,935 A | 4/2000 | Takeuchi et al. |
| 6,054,734 A | 4/2000 | Aozasa et al. |
| 6,091,633 A | 7/2000 | Cernea et al. |
| 6,101,125 A | 8/2000 | Gorman |
| 6,103,573 A | 8/2000 | Harari et al. |
| 6,104,072 A | 8/2000 | Hirota |
| 6,137,718 A | 10/2000 | Reisinger |
| 6,151,248 A | 11/2000 | Harari et al. |
| 6,177,318 B1 | 1/2001 | Ogura et al. |
| 6,181,597 B1 | 1/2001 | Nachumovsky |
| 6,201,282 B1 | 3/2001 | Eitan |
| 6,215,148 B1 | 4/2001 | Eitan |
| 6,215,702 B1 | 4/2001 | Derhacobian et al. |
| 6,222,762 B1 | 4/2001 | Guterman et al. |
| 6,248,633 B1 | 6/2001 | Ogura et al. |
| 6,255,166 B1 | 7/2001 | Ogura et al. |
| 6,266,281 B1 | 7/2001 | Derhacobian et al. |
| 6,281,075 B1 | 8/2001 | Yuan et al. |
| 6,313,503 B1 | 11/2001 | Lee et al. |
| 6,331,953 B1 | 12/2001 | Wang et al. |
| 6,346,725 B1 | 2/2002 | Ma et al. |
| 6,349,062 B1 | 2/2002 | Thurgate |
| 6,366,501 B1 | 4/2002 | Thurgate et al. |
| 6,388,293 B1 | 5/2002 | Ogura et al. |
| 6,399,441 B1 | 6/2002 | Ogura et al. |
| 6,406,960 B1 | 6/2002 | Hopper et al. |
| 6,413,821 B1 | 7/2002 | Ebina et al. |
| 6,418,062 B1 | 7/2002 | Hayashi et al. |
| 6,436,768 B1 | 8/2002 | Yang et al. |
| 6,445,030 B1 | 9/2002 | Wu et al. |
| 6,456,528 B1 | 9/2002 | Chen |
| 6,459,622 B1 | 10/2002 | Ogura et al. |
| 6,472,706 B2 | 10/2002 | Widdershoven et al. |
| 6,477,088 B2 | 11/2002 | Ogura et al. |
| 6,487,121 B1 | 11/2002 | Thurgate et al. |
| 6,493,266 B1 | 12/2002 | Yachareni et al. |
| 6,531,350 B2 | 3/2003 | Satoh et al. |
| 6,531,732 B2 | 3/2003 | Sugita et al. |
| 6,548,861 B2 | 4/2003 | Palm et al. |
| 6,549,463 B2 | 4/2003 | Ogura et al. |
| 6,552,387 B1 | 4/2003 | Eitan |
| 6,555,865 B2 | 4/2003 | Lee et al. |
| 6,580,120 B2 | 6/2003 | Haspeslagh |
| 6,583,007 B1 | 6/2003 | Eitan |
| 6,636,438 B2 | 10/2003 | Ogura et al. |
| 6,670,240 B2 | 12/2003 | Ogura et al. |
| 6,670,669 B1 | 12/2003 | Kawamura |
| 6,677,200 B2 | 1/2004 | Lee et al. |
| 6,709,922 B2 | 3/2004 | Ebina et al. |
| 6,735,118 B2 | 5/2004 | Ogura et al. |
| 6,858,906 B2 | 2/2005 | Lee et al. |
| 6,897,522 B2 | 5/2005 | Harari et al. |
| 6,925,007 B2 | 8/2005 | Harari et al. |
| 7,341,918 B2 | 3/2008 | Harari et al. |
| 7,342,279 B2 | 3/2008 | Harari et al. |
| 7,479,677 B2 | 1/2009 | Harari et al. |
| 7,579,247 B2 * | 8/2009 | Harari et al. ............... 438/287 |
| 2001/0021126 A1 | 9/2001 | Lavi et al. |
| 2001/0055838 A1 | 12/2001 | Walker et al. |
| 2002/0005545 A1 | 1/2002 | Widdershoven et al. |
| 2002/0064911 A1 | 5/2002 | Eitan |
| 2002/0105023 A1 | 8/2002 | Kuo et al. |
| 2002/0118574 A1 | 8/2002 | Gongwer et al. |
| 2002/0130350 A1 | 9/2002 | Shin et al. |
| 2002/0149060 A1 | 10/2002 | Ogura et al. |
| 2002/0196665 A1 | 12/2002 | Kim |
| 2003/0016561 A1 | 1/2003 | Lee et al. |
| 2003/0030097 A1 | 2/2003 | Lee et al. |
| 2003/0057435 A1 | 3/2003 | Walker |
| 2003/0080370 A1 | 5/2003 | Harari et al. |
| 2003/0080372 A1 | 5/2003 | Mikolajick |
| 2003/0081456 A1 | 5/2003 | Mikolajick |
| 2003/0081460 A1 | 5/2003 | Choi et al. |
| 2003/0099144 A1 | 5/2003 | Kim et al. |
| 2003/0123307 A1 | 7/2003 | Lee et al. |
| 2003/0134476 A1 | 7/2003 | Roizin et al. |
| 2003/0193827 A1 | 10/2003 | Choi |
| 2003/0198104 A1 | 10/2003 | Lee |
| 2003/0209754 A1 | 11/2003 | Haspeslagh |
| 2003/0211689 A1 | 11/2003 | Yoo et al. |
| 2003/0219947 A1 | 11/2003 | Shin et al. |
| 2003/0224564 A1 | 12/2003 | Kang et al. |
| 2004/0000688 A1 | 1/2004 | Harari et al. |
| 2004/0009642 A1 | 1/2004 | Yoo et al. |
| 2004/0009645 A1 | 1/2004 | Yoo |

FOREIGN PATENT DOCUMENTS

| | | |
|---|---|---|
| EP | 1 091 418 A2 | 4/2001 |
| EP | 1 096 505 A1 | 5/2001 |
| EP | 1 376 676 A2 | 2/2004 |
| JP | 58-102394 | 6/1983 |
| JP | H05-094699 | 4/1993 |
| JP | H05-129564 | 5/1993 |
| JP | H05-129624 | 5/1993 |
| JP | 11-224940 | 8/1999 |
| JP | 2001-102466 | 4/2001 |
| JP | 2001-110918 | 4/2001 |
| JP | 2001-148434 A | 5/2001 |
| JP | 2001-237330 | 8/2001 |
| KR | 2000-0005467 A | 1/2000 |
| SU | 960953 A | 9/1982 |
| WO | WO 97/15929 A1 | 5/1997 |
| WO | WO 98/03977 A1 | 1/1998 |
| WO | WO01/13378 A1 | 2/2001 |

| | | | |
|---|---|---|---|
| WO | WO 01/65567 A | 9/2001 | |
| WO | WO03/015173 A2 | 2/2003 | |

OTHER PUBLICATIONS

"Basic Programming Mechanisms," *Nonvolatile Semiconductor Memory Technology—A Comprehensive Guide to Understanding and Using NVSM Devices*, IEEE Press series on microelectronic systems, 1998, pp. 9-25.

Chan et al., "A true single-transistor oxide-nitride-oxide EEPROM device," *IEEE Electron Device Letters*, vol. EDL-8, No. 3, Mar. 1987, pp. 93-95.

K. T. Chang et al., "A new SONOS memory using source-side injection for programming," *IEEE Electron Device Lett.*, vol. 19, 1998, pp. 253-255.

Chen, Wei-Ming et al., "A Novel Flash Memory Device with SPlit Gate Source Side Injection and ONO Charge Storage Stack (SPIN)", 1997 Symposium on VLSI Technology Digest of Technical Papers, pp. 63-64.

D. J. DiMaria et al., "Electrically-alterable read-only-memory using Si-rich $SiO_2$ injectors and a floating polycrystalline silicon storage layer," *J. Appl. Phys.*, 52(7), Jul. 1981, pp. 4825-4842.

DiMaria, D.J., "Insulator Physics and Engineering: Electrically-Alterable Read-Only-Memory Applications", Oct. 1981, Journal De Physique, C4, No. 10, Tome 42, pp. C4-1115-21.

Boaz Eitan et al., "Can NROM, a 2 Bit, Trapping Storage NMV Cell, Give a Real Challenge to Floating Gate Cells?", Extended Abstracts, 1999 Conference on Solid State Devices and Materials, Tokyo, 1999, pp. 522-524.

Eitan et al., "NROM: A novel localized trapping, 2-bit nonvolatile memory cell," *IEEE Electron Device Letters*, vol. 21, No. 11, Nov. 2000, pp. 543-545.

Eitan et al., "Hot-Electron Injection into the Oxide in n-channel MOS Devices," *IEEE Transactions on Electron Devices*, vol. Ed-28, No. 3, Mar. 1981, pp. 328-340.

Eitan et al., "Multilevel flash cells and their trade-offs," *IEDM Tech. Dig.*, 1996, pp. 169-172.

D. Frohman-Bentchkowsky, *Applied Physics Letters*, vol. 18, 1971, pp. 332-334.

D. Frohman-Bentchkowsky, "FAMOS—A new semiconductor charge storage device," *Solid-State Electron.*, 1974, vol. 17, pp. 517-529.

I. Fujiwara et al., "0.13 um MONOS single transistor memory cell with separated source lines," *IDEM Tech. Dig.*, 1998, pp. 995-998.

F.I. Hampton et al., "Space Charge Distribution Limitation on Scale Down of MNOS Memory Devices", 1979, IEDM Technical Digest, pp. 374-377.

Luc Haspeslagh, "Two Bit Non-Volatile Electrically Erasable and Programmable Memory Structure, a Process for Producing Said Memory Structure and Methods for Programming and Erasing Said Memory Structure", U.S. Appl. No. 60/296,618, filed Jun. 7, 2001, priority claimed by US6,580,120.

Hayashi, Yutaka et al., "Twin MONOS Cell With Dual Control Gates", 2000 Symposium on VLSI Technology Digest of Technical Papers, pp. 122-123.

Takashi Hori et al., "A MOSFET with Si-implanted Gate-$SiO_2$ Insulator for Nonvolatile Memory Applications," *IEEE*, 0-7803-0817-4/92, pp. 17.7.1-17.7.4.

Hsia, Yukun, "Memory Applications of the MNOS", Wescon Technical Papers, vol. 16, 1972, pp. 3303-3308.

Kamiya, M., et al., "EPROM Cell With High Gate Injection Efficiency," *International Electronic Devices Meeting of IEEE* San Francisco, California, (Dec. 13-15, 1982) pp. 741-744.

Krick, P.J., "Dual-Level Sense Scheme for Composite Insulator Memory Arrays", IBM technical Disclosure Bulletin, vol. 17, No. 6, Nov. 1974, pp. 1811-1813.

P.J. Krick, "Three-state MNOS FET memory array," *IBM Technical Disclosure Bulletin*, vol. 18, No. 12, May 1976, pp. 1492-1943.

Lai, S.K. et al., "Comparison and Trends in Today's Dominant E2 Technologies", IEEE, IEDM 86, 1986, pp. 580-583.

Nozaki, "A 1-Mb EEPROM with a MONOS memory cell for a semi-conductor disk application," *IEEE Journal of Solid State Circuits*, vol. 26, No. 4, Apr. 1991, p. 497-501.

S. Ogura et al., "Low Voltage, Low Current, High Speed Program Step Split Gate Cell With Ballistic Direct Injection for EEPROM/Flash", 1998, IEDM Technical Digest, 36.5, pp. 987-990.

Roizin, Yakov, et al., "Novel Techniques for Data Retention and Leff Measurements in Two Bit microFLASH® Memory Cells", AIP Conference Proceedings, vol. 550, Melville, New York, 2001, pp. 181-185.

Eiichi Suzuki et al., "A Low-Voltage Alterable EEPROM With Metal-Oxide-Nitride-Oxide-Semiconductor (MONOS) Structures", IEEE Transactions on Electron Devices, vol. ED-30, No. 2, Feb. 1883, pp. 122-128.

Y. Tarui et al., "Electrically Reprogrammable Nonvolatile Semiconductor Memory", IEEE Journal of Solid State Circuits, vol. SC-7, No. 5, Oct. 1972, pp. 369-375.

Jan Van Houdt et al., "Multiple Bit Nonvolatile Memory Device and Method for Fabricating the Same", U.S. Appl. No. 60/391,565, filed Jun. 24, 2002, priority claimed by EP1376676.

"Notification of Transmittal of the International Search Report of the Declaration", corresponding PCT application No. PCT/US02/35132, International Searching Authority, United States Patent Office, Oct. 31, 2002, 3 pages.

Office Action dated Apr. 5, 2004, United States Patent and Trademark Office, U.S. Appl. No. 10/161,235, 19 pages.

"Notification of Transmittal of the International Search Report of the Declaration", corresponding PCT application No. PCT/US02/35132, International Searching Authority, United States Patent Office, Mar. 21, 2003, 4 pages.

EPO, "Supplementary European Search Report", mailed in related European Application No. EP 02 78 4379 on Jul. 15, 2005, 1 page.

EPO, "Examiner's First Report," mailed in related European Application No. 02 784 379.6 on Jan. 26, 2006, 2 pages.

China State Intellectual Property Office, "First Office Action," corresponding in PRC (China) Patent Application No. 02826596.3, mailed on Dec. 29, 2006, 12 pages. (including translation).

EPO Communication and European Search Report in corresponding Application No. 07002288.4, Apr. 13, 2007, 4 pages.

EPO Communication and European Search Report in corresponding Application No. 07002287.6, Apr. 16, 2007, 7 pages.

EPO Communication and European Search Report in corresponding European Application No. 07002289.2, Apr. 16, 2007, 7 pages.

U.S. Office Action for U.S. Appl. No. 11/075,423 mailed Apr. 17, 2007, 24 pages.

Office Action, Taiwanese Application No. 91132182 for SanDisk Corporation, mailed May 30, 2007, 5 pages.

European Search Report, Application No. EP 07002287.6 for SanDisk Corporation, mailed Jul. 27, 2007. 6 pages.

European Search Report for Application No. 07002288.4 for SanDisk Corporation, mailed Jul. 27, 2007, 4 pages.

European Search Report for Application No. 07002289.2 for SanDisk Corporation, mailed Jul. 27, 2007, 7 pages.

Office Action for Chinese Patent Application No. 02826596.3, Aug. 17, 2007, 6 pages. (including translation).

Second Office Action, PRC Application No. 02826596.3 for SanDisk Corporation, mailed Sep. 11, 2007, 2 pages.

Third Office Action for Chinese Application No. 02826596.3 mailed Feb. 22, 2008, 8 pages.

EPO, "Office Action," corresponding European Patent Application No. 07002287.6, mailed on Jun. 23, 2008, 4 pages.

EPO, "Office Action," corresponding European Patent Application No. 07002289.2, mailed on Jun. 23, 2008, 3 pages.

China State Intellectual Property Office, "Office Action," corresponding Chinese Patent Application No. 02826596.3, mailed on Jul. 4, 2008, 2 pages (translation.).

Korean Patent Office, "Notice of Preliminary Rejection," corresponding Korean Patent Application No. 204-7006651, mailed on Nov. 3, 2008, 6 pages (including translation.).

China State Intellectual Property Office, "Office Action," corresponding Chinese Patent Application No. 02826596.3, mailed on Oct. 10, 2008, 5 pages (including translation.).

Notification of Reasons for Refusal for Patent Application No. 2003-541063 dated Jul. 14, 2009, 9 pages.

First Office Action of China State Intellectual Property Office, Chinese Application No. 200710135802.3, Dated Sep. 2, 2009, 9 pages.

Office Action and Search Report for Taiwanese Patent Application No. 96151683, Dated Mar. 29, 2010, 3 pages.

Reasons for Final Rejection, Korean Patent Application No. 2004-7006651, , Dated Sep. 18, 2009, 5 pages.

Office Action for Korean Patent Application No. 2009-7025906 mailed Apr. 28, 2010, 6 pages.

Office Action for Chinese Patent Application No. 200710135802.3 mailed Apr. 28, 2010, 9 pages.

Notice of Preliminary Rejection, Korean Patent Application No. 2004-7006651, Dated Feb. 26, 2010, 6 pages.

Preliminary Examination for Taiwan Patent Application No. 96151684 dated Jul. 20, 2010, 11 pages.

Reasons for Refusal for Japanese Patent Application No. 2003-541063 dated Jul. 2, 2010, 7 pages.

Communication Pursuant to Article 94(3) for European Application No. 07 002 287.6, mailed May 13, 2010, 6 pages.

* cited by examiner

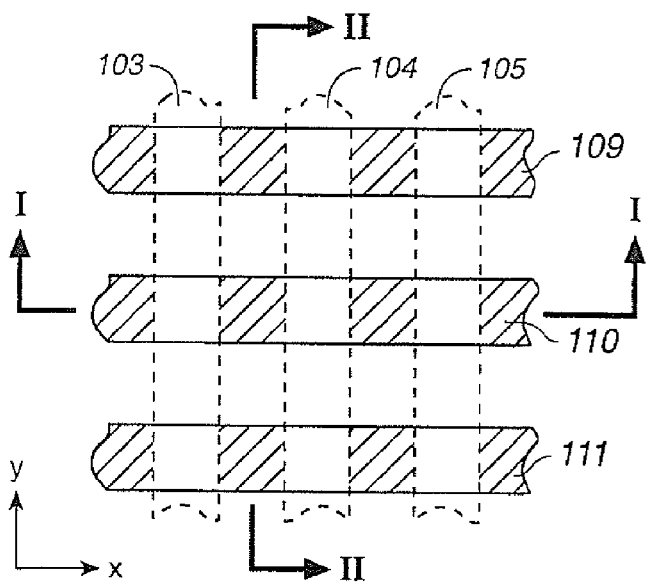
FIG._1
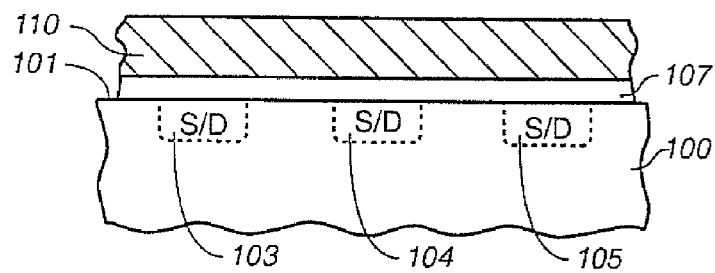
(SECTION I-I)
FIG._2A
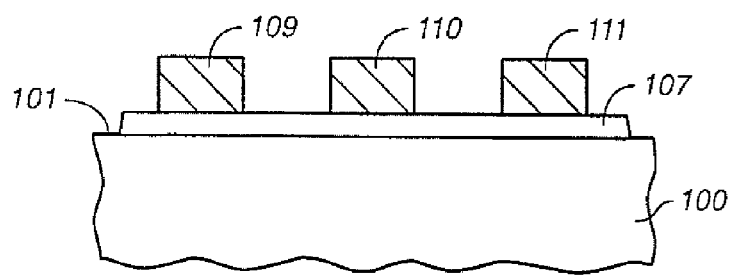
(SECTION II-II)
FIG._2B

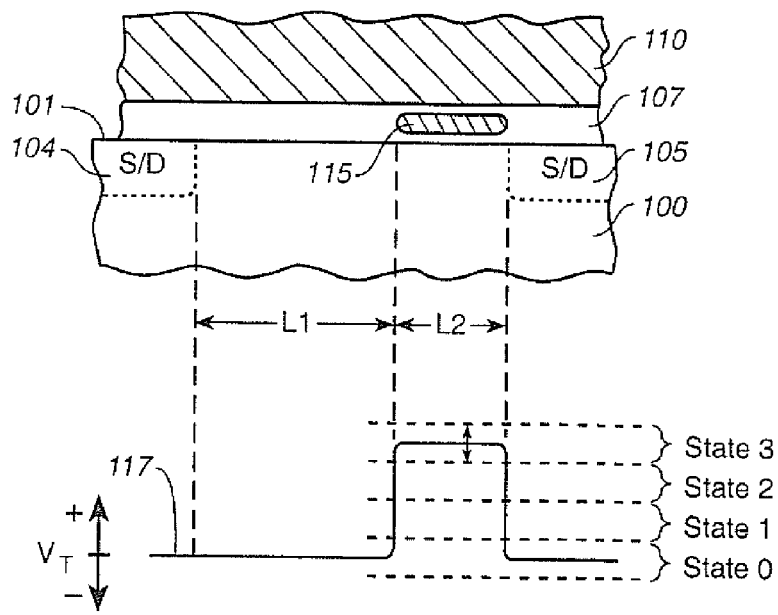
FIG._3
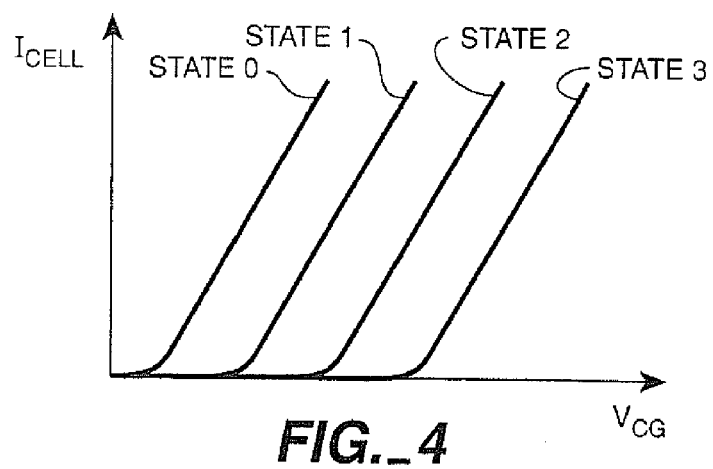
FIG._4
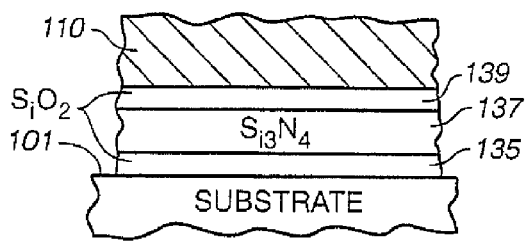
FIG._6A
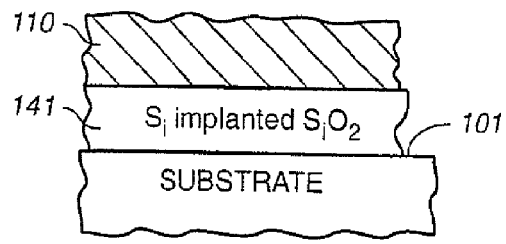
FIG. 6B

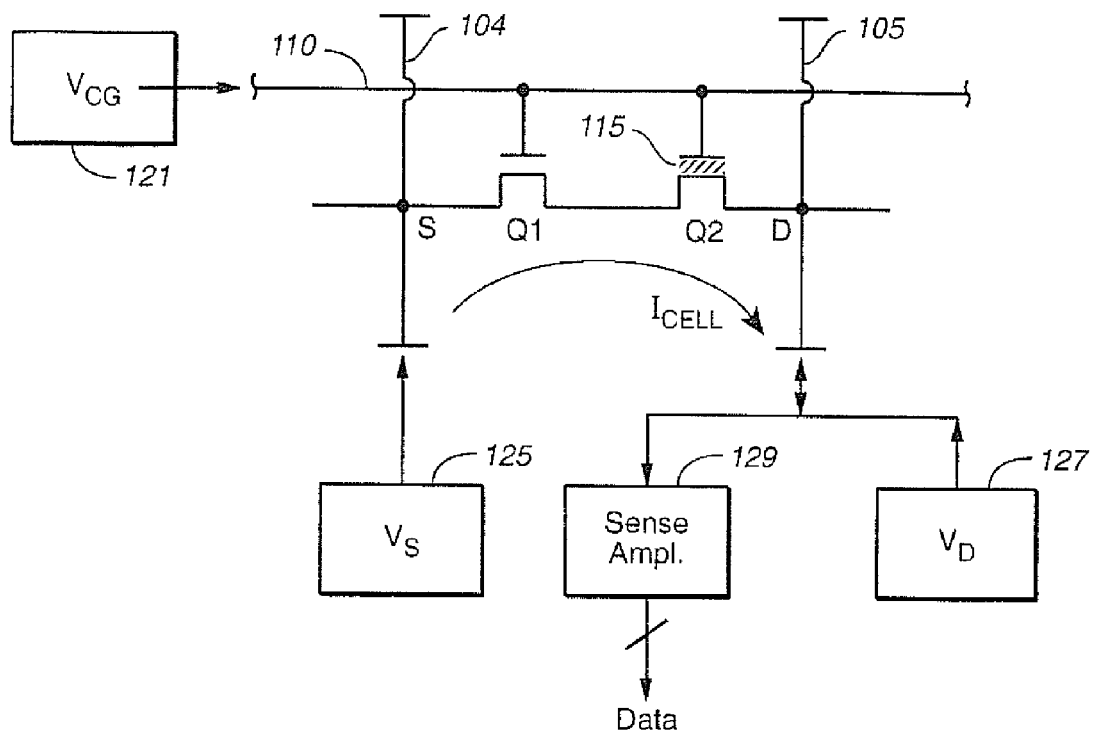
FIG._5
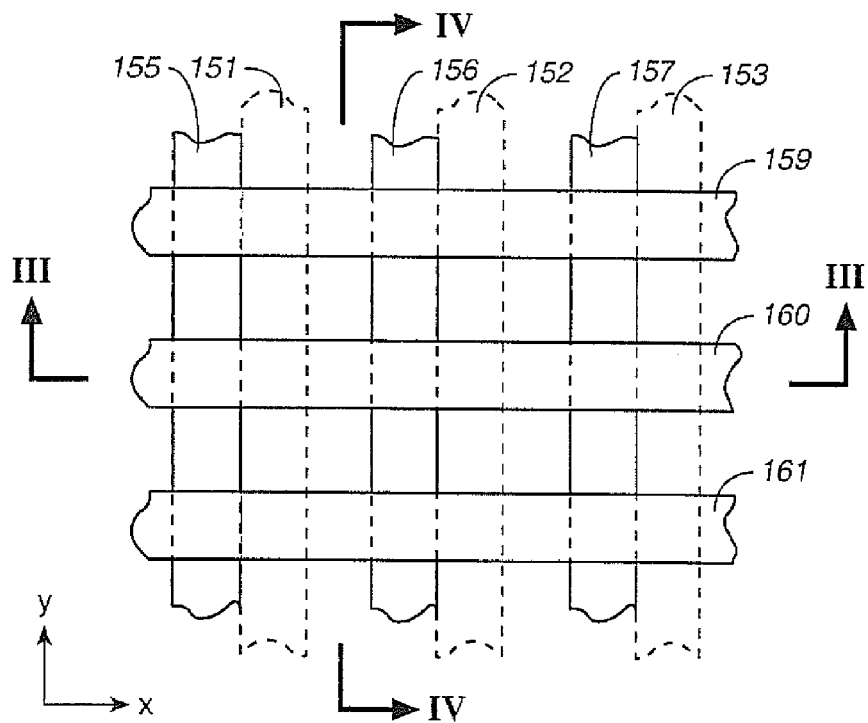
FIG._7

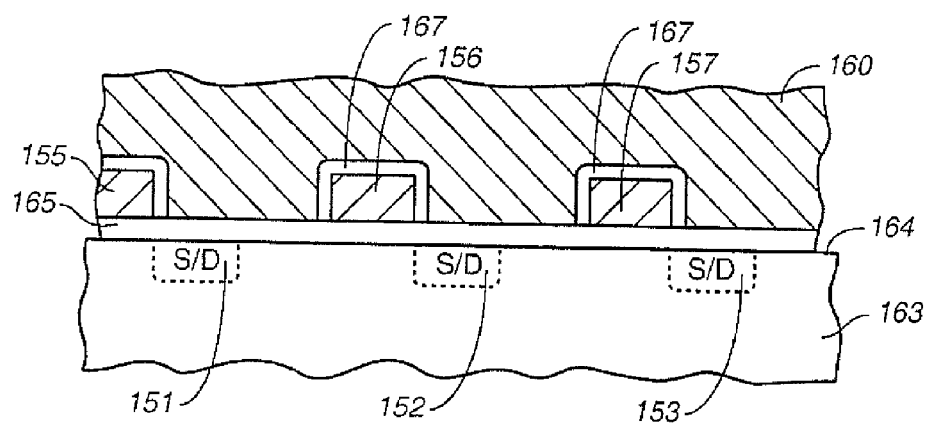
(SECTION III-III)
FIG._8A
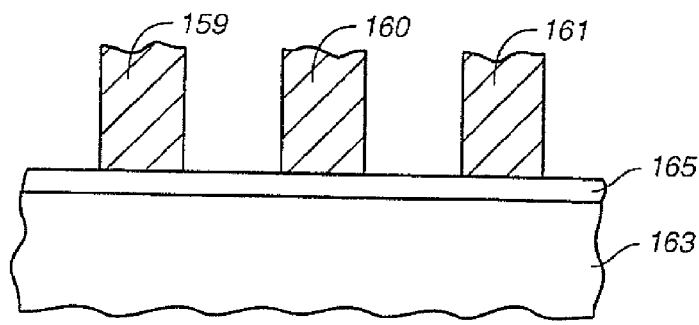
(SECTION IV-IV)
FIG._8B
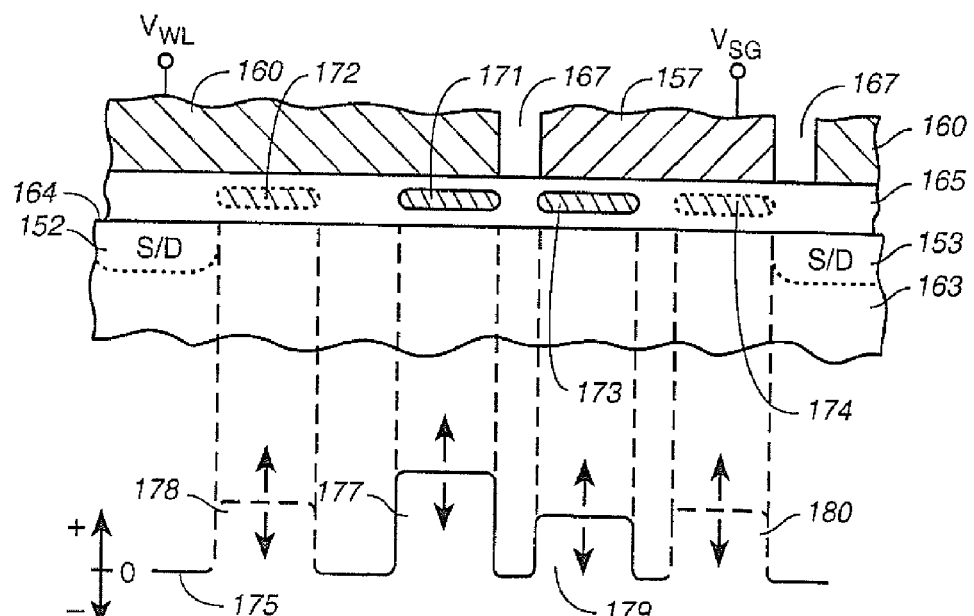
FIG._9

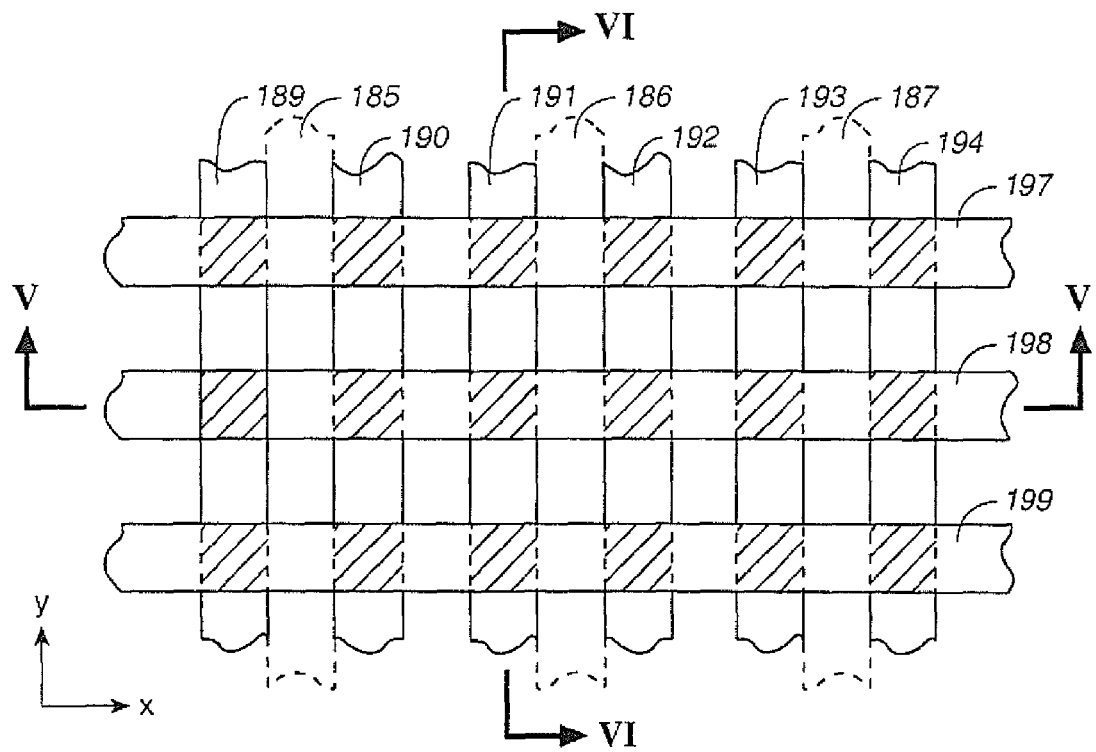
FIG._10
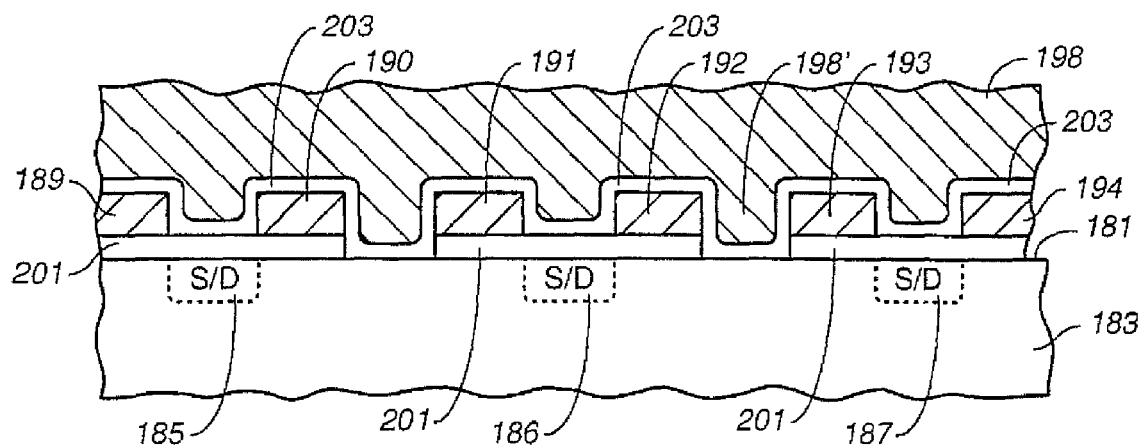
(SECTION V-V)
FIG._11A

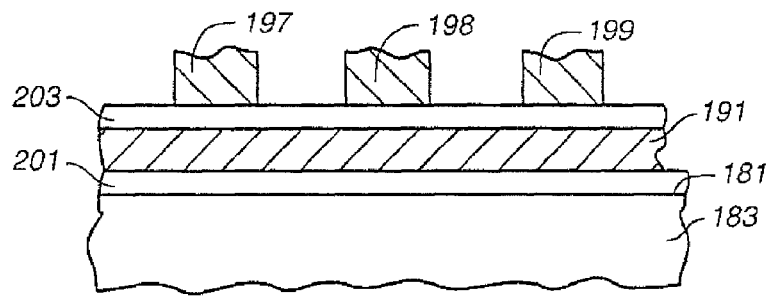
(SECTION VI-VI)
FIG._11B
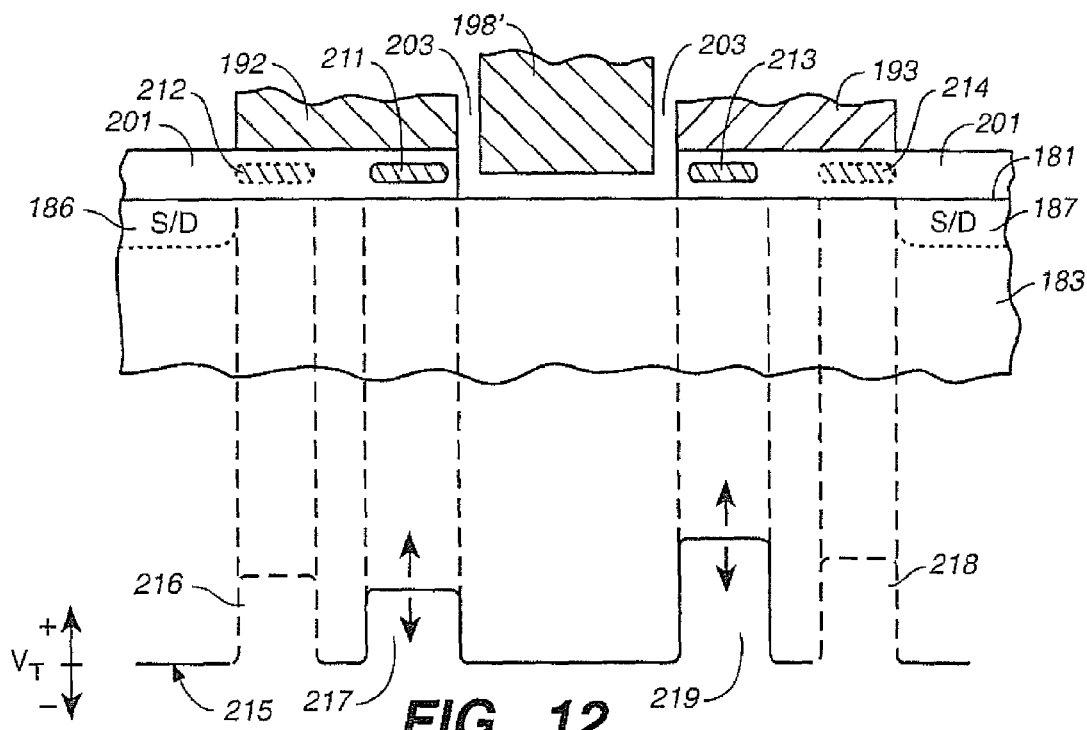
FIG._12
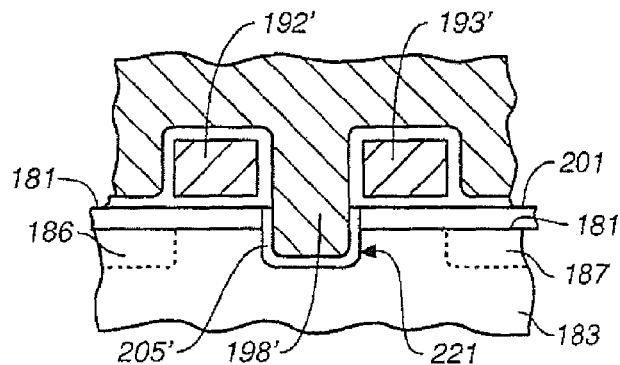
FIG._13

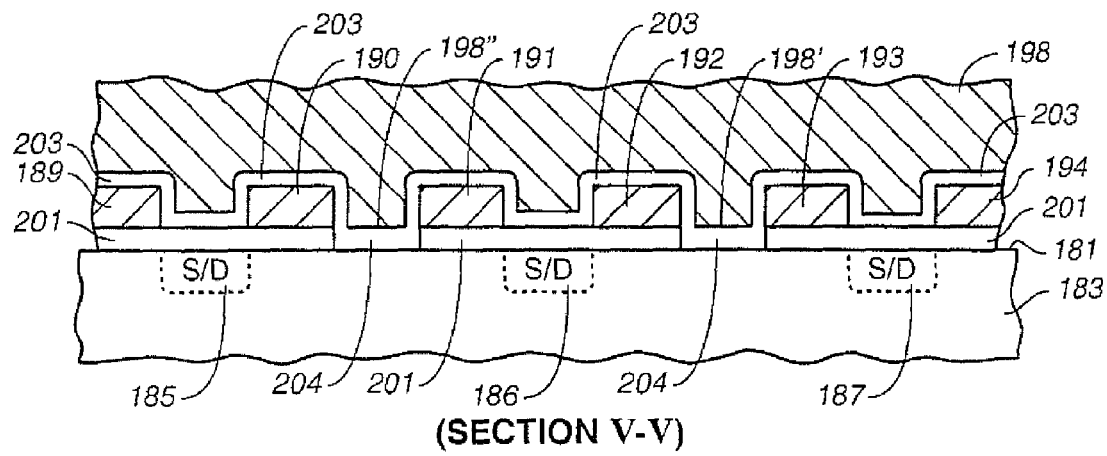
*FIG._14*
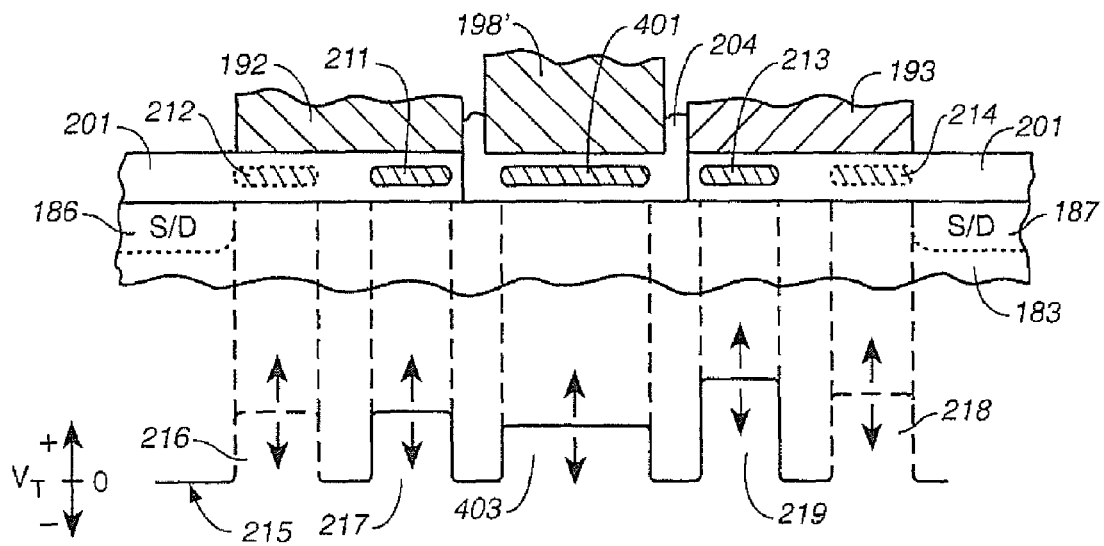
*FIG._15*
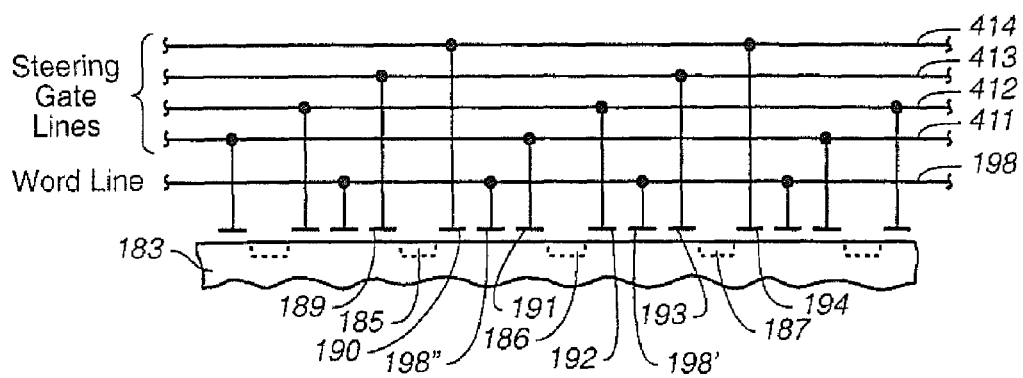
*FIG._16*

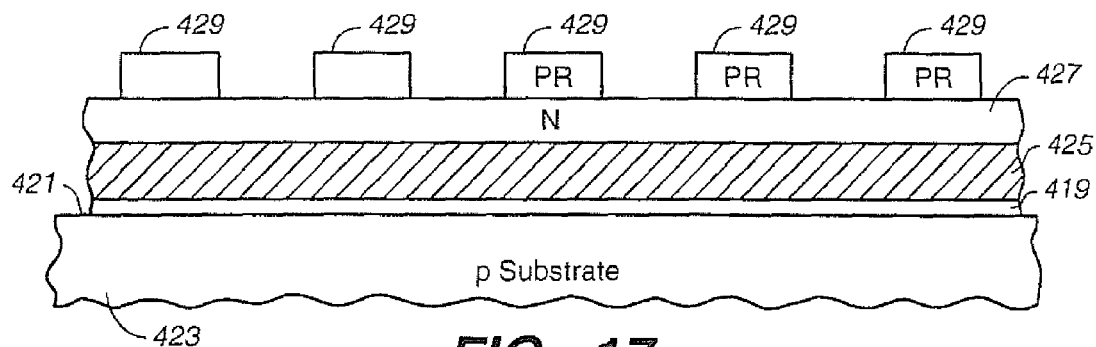
FIG._17
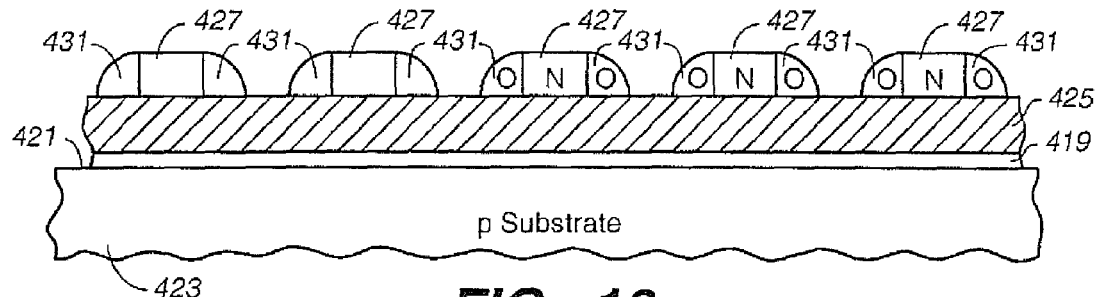
FIG._18
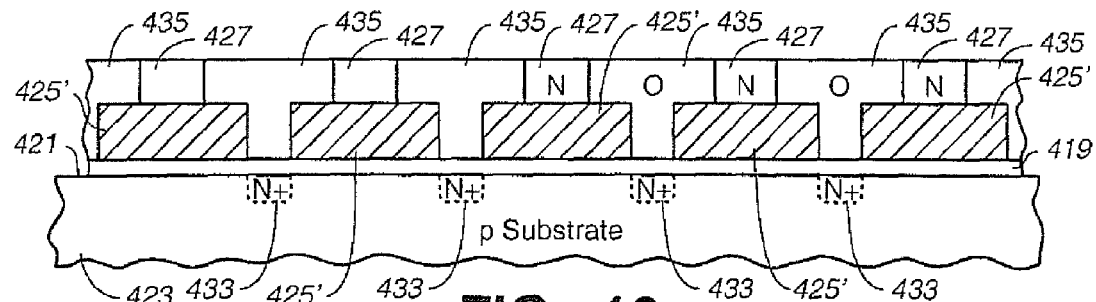
FIG._19
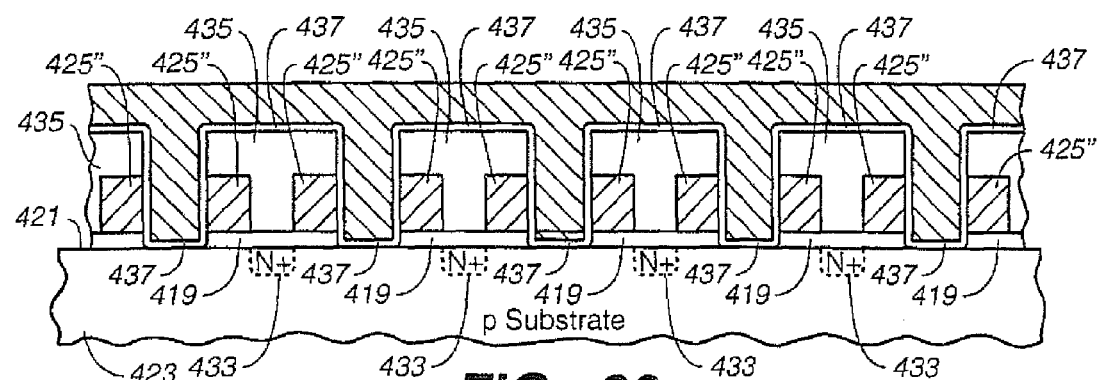
FIG._20

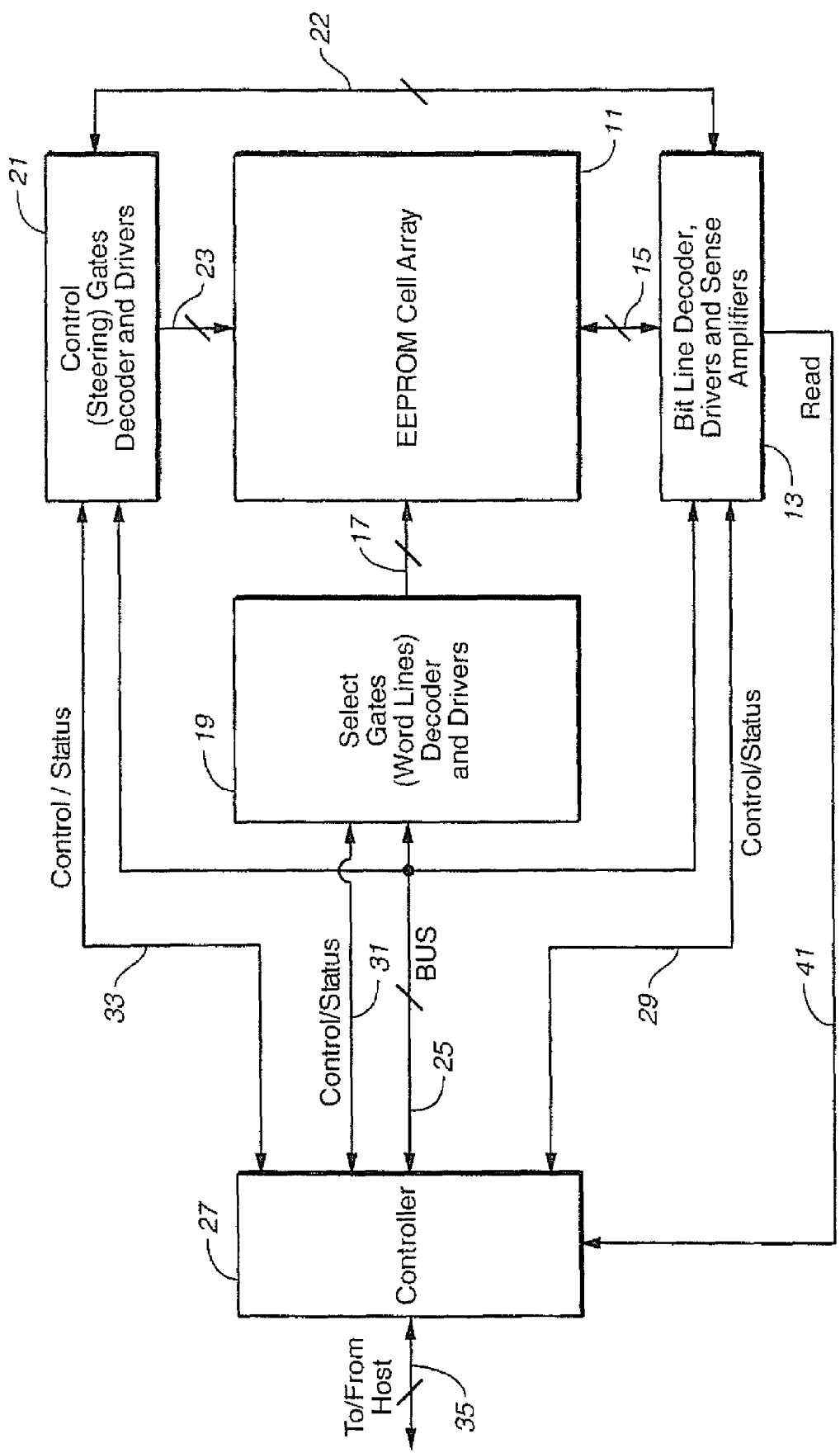
FIG._21

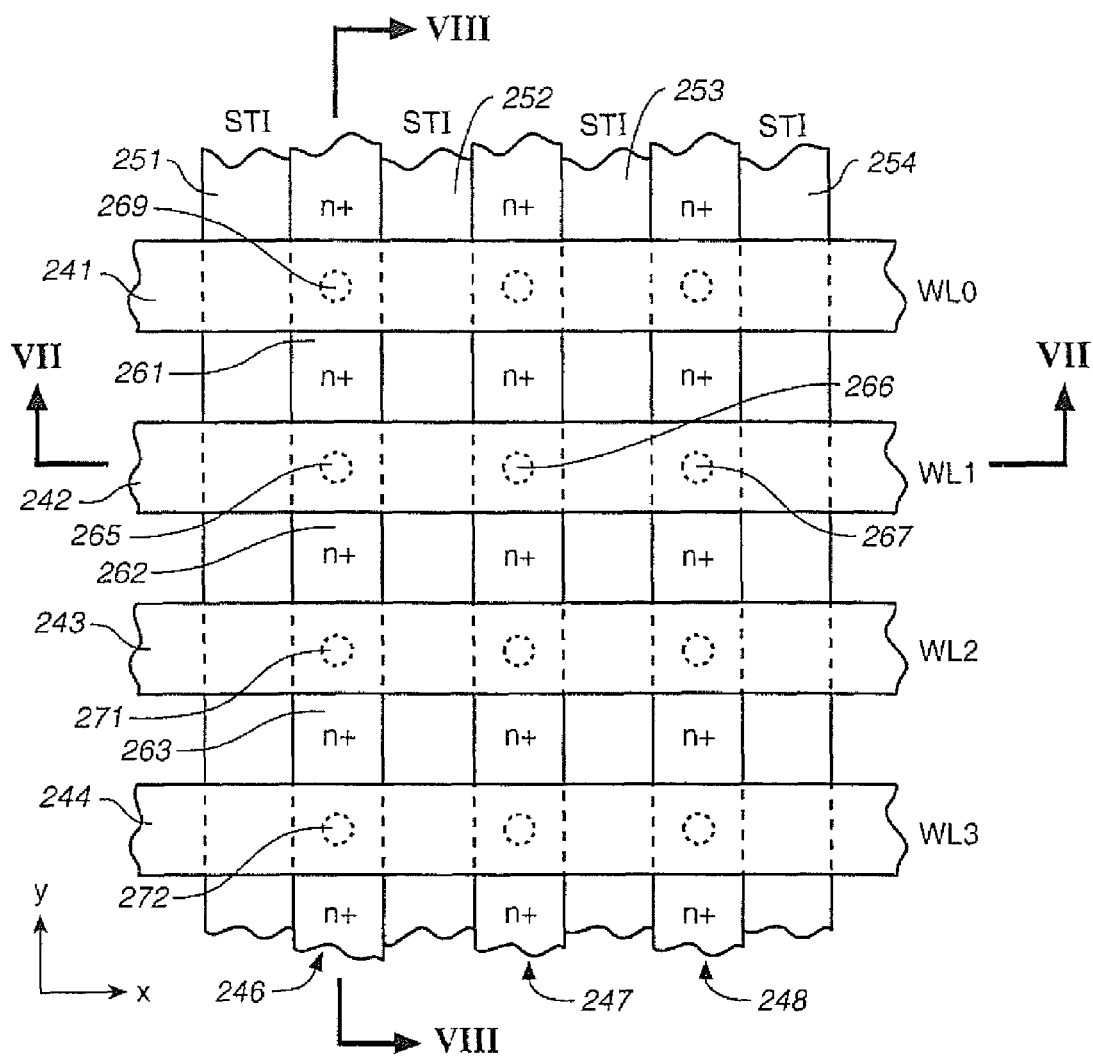
FIG._22
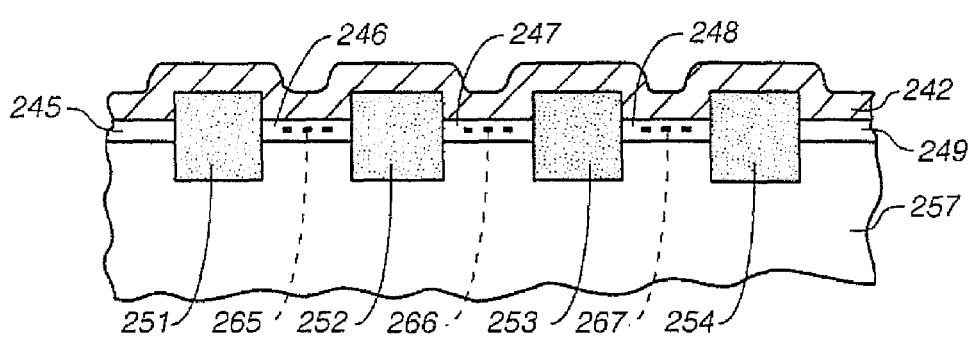
(SECTION VII-VII)
FIG._23A

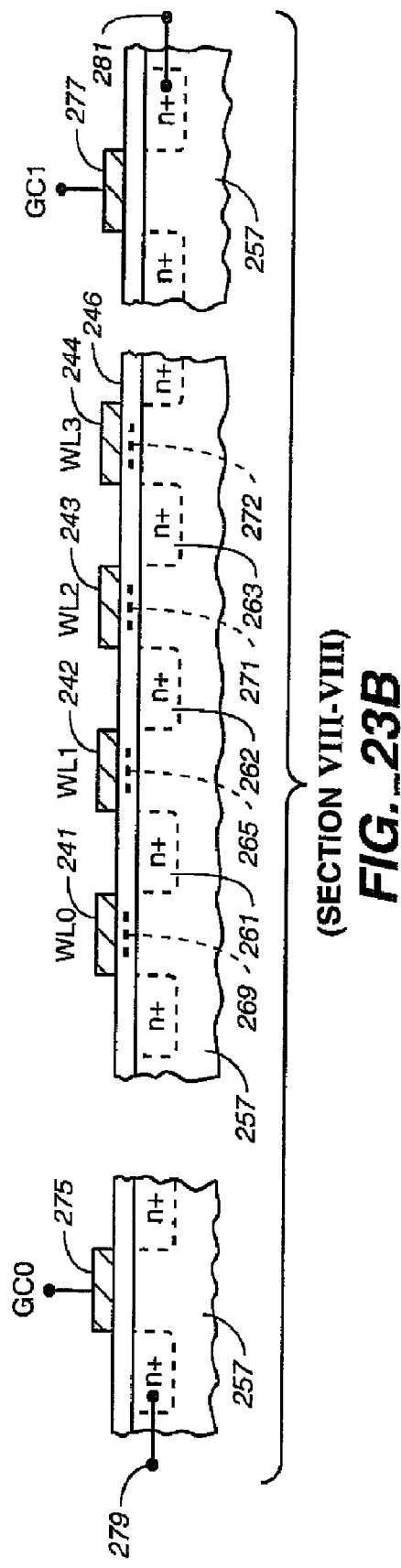
FIG._23B (SECTION VIII-VIII)
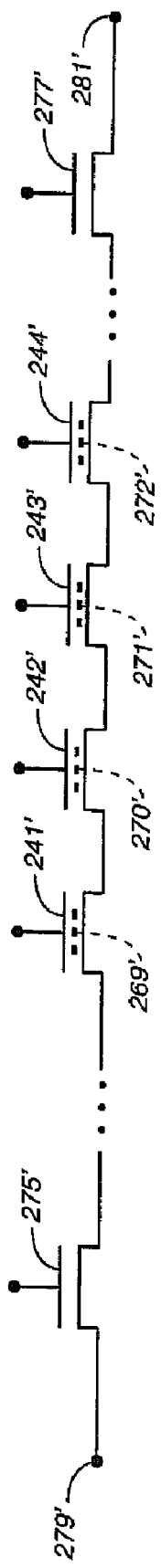
FIG._24

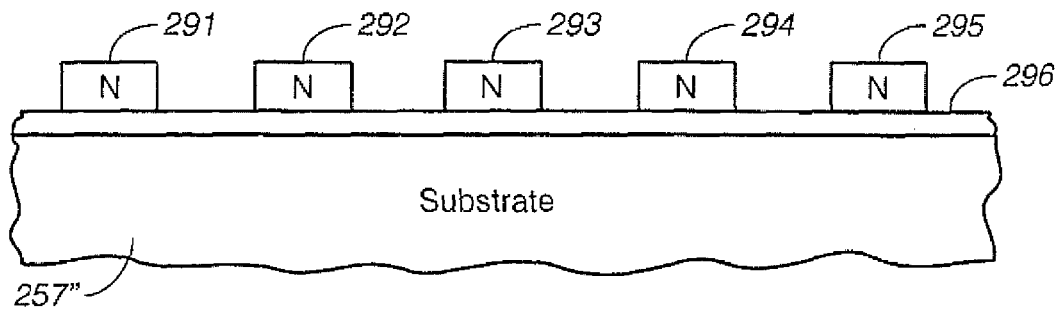
(SECTION VII-VII)
FIG._25A
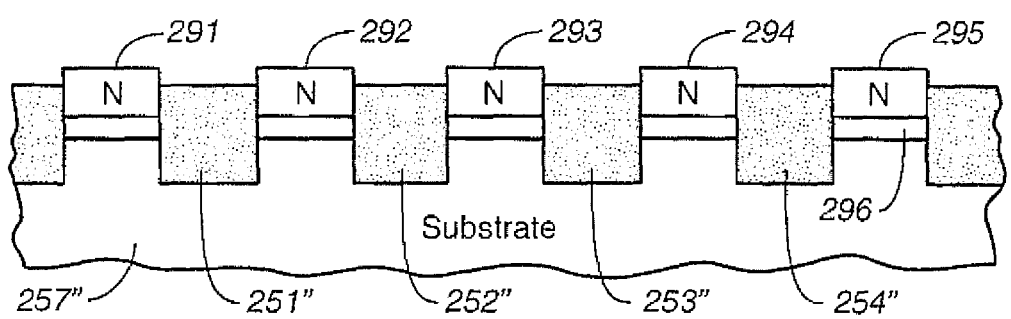
FIG._25B
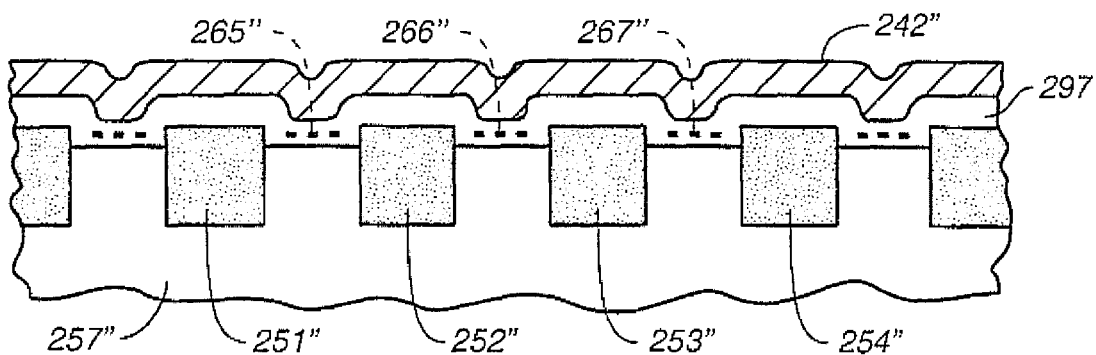
FIG._25C

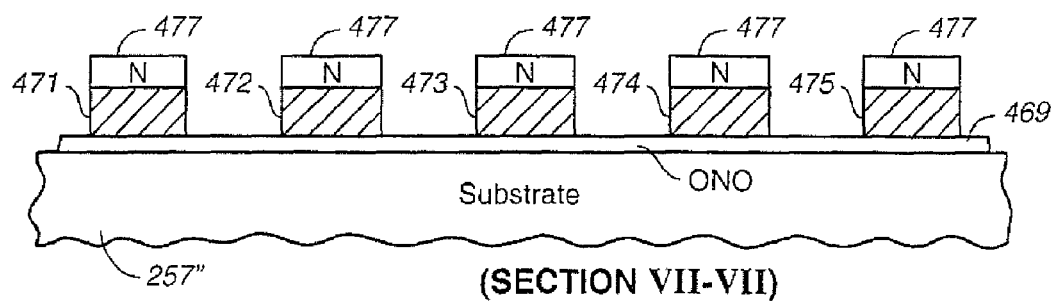
*FIG.\_26A*
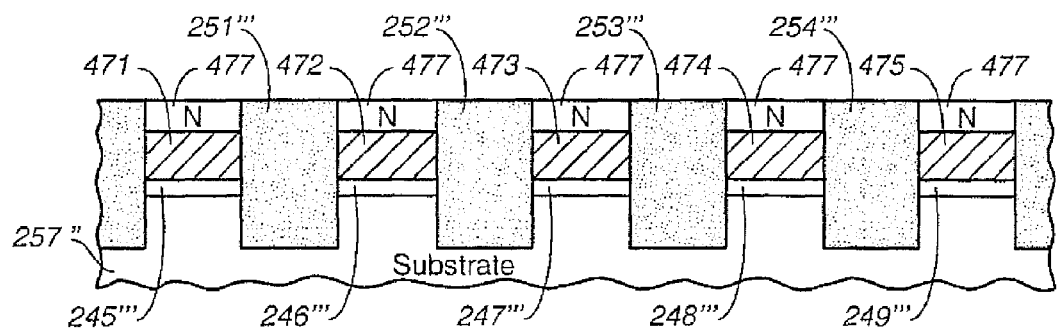
*FIG.\_26B*
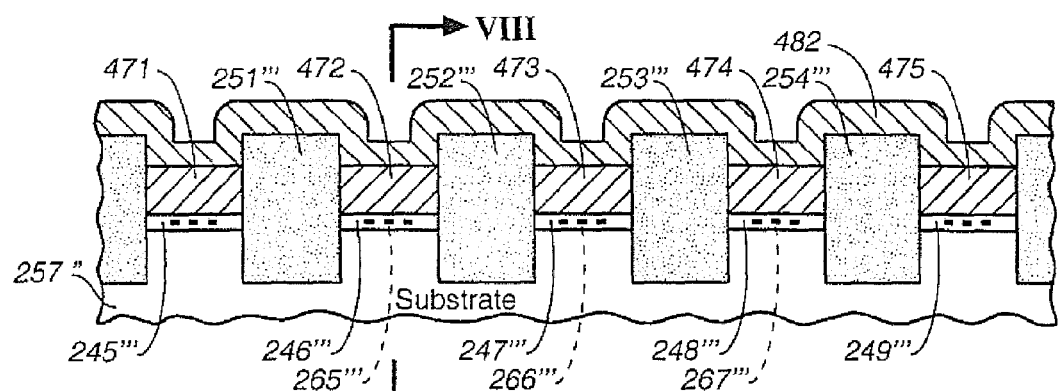
*FIG.\_26C*
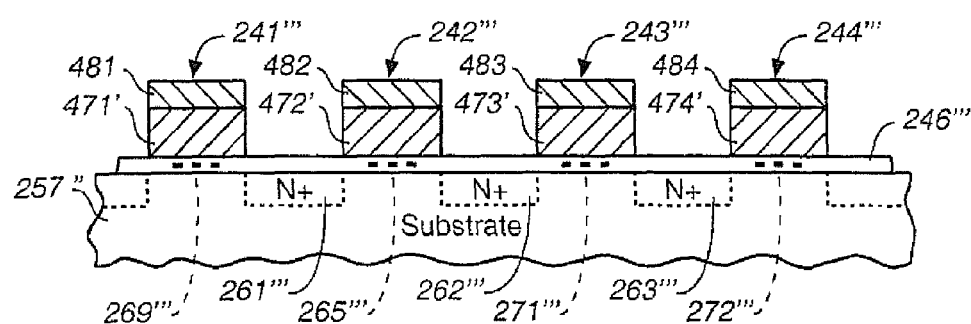
*FIG.\_26D*

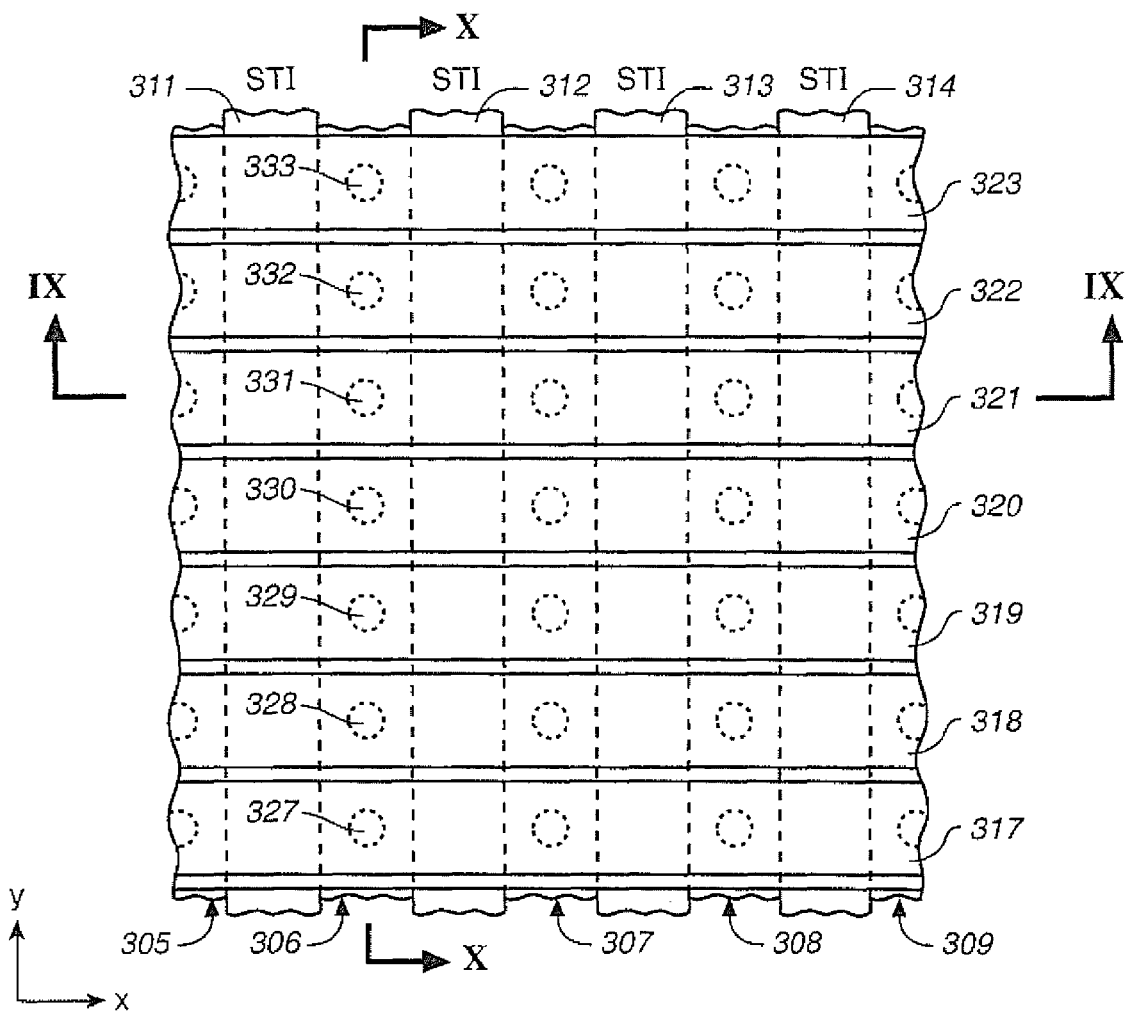
FIG._27

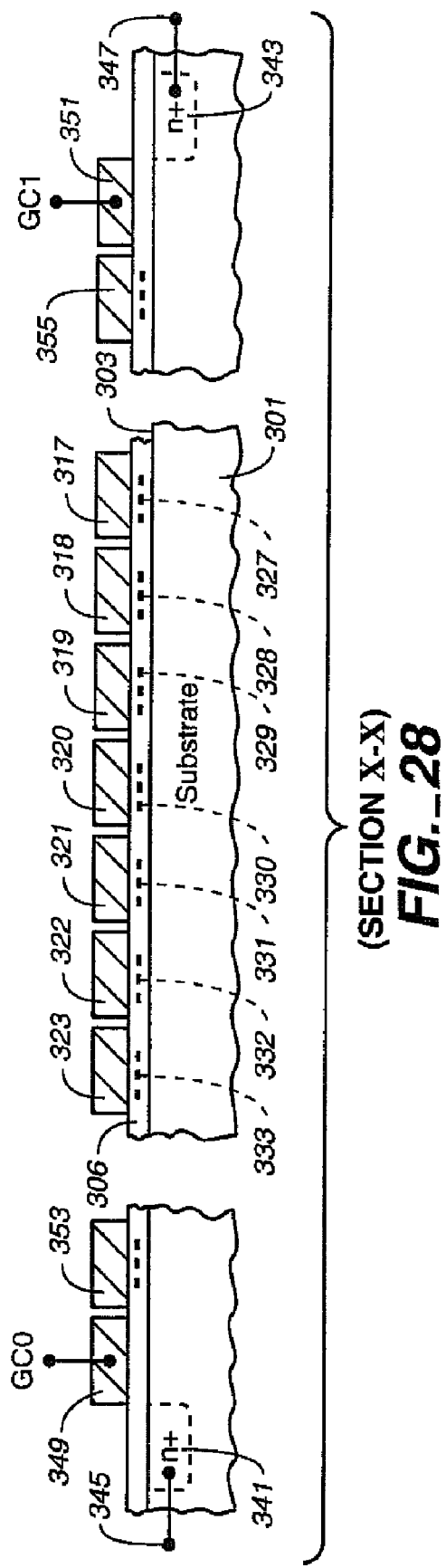
FIG. 28 (SECTION X-X)

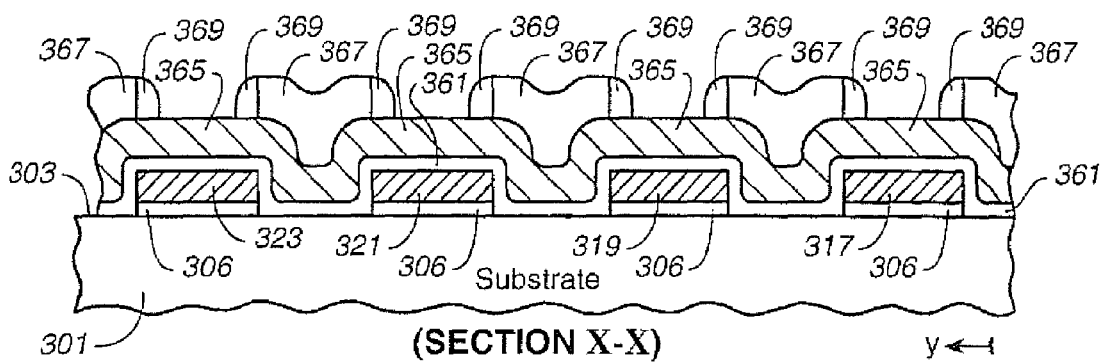
FIG._29A
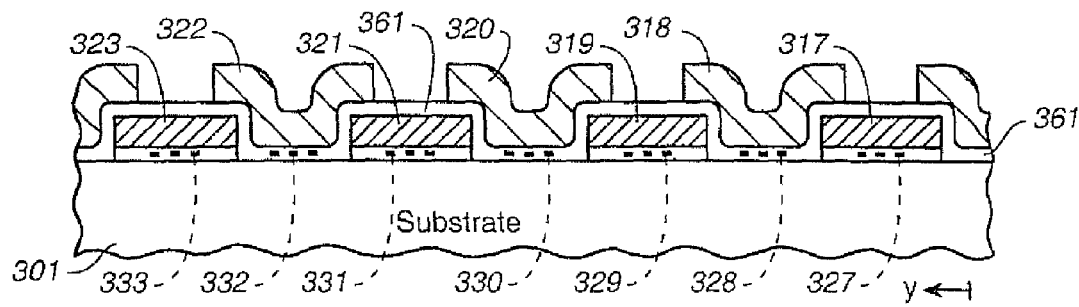
FIG._29B
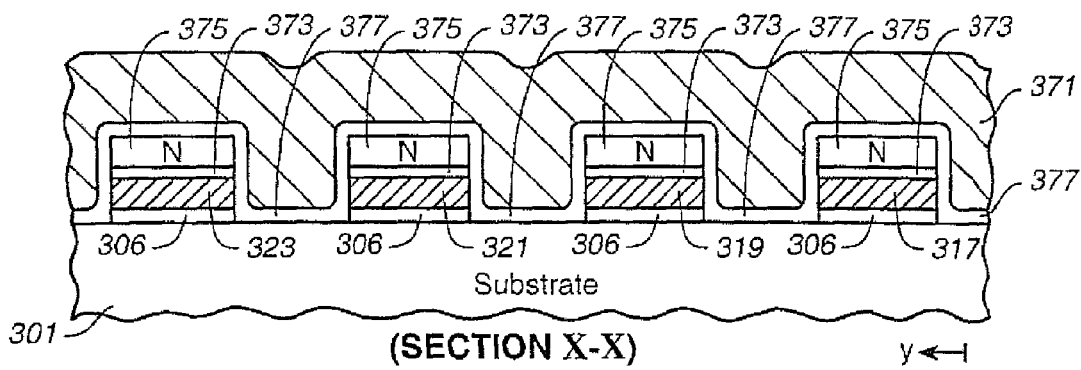
FIG._30A
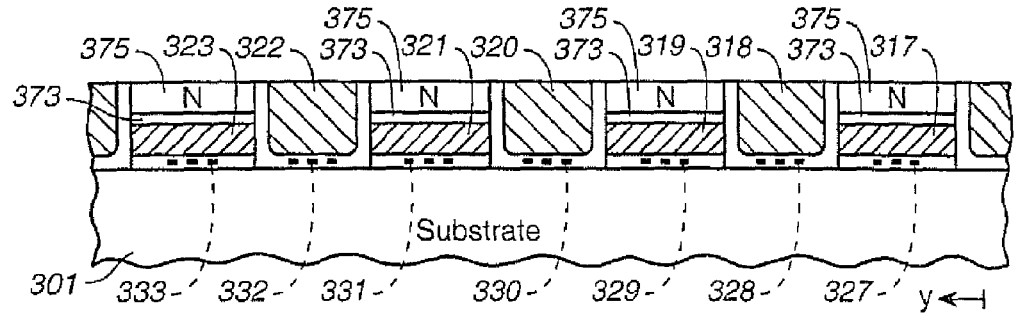
FIG._30B

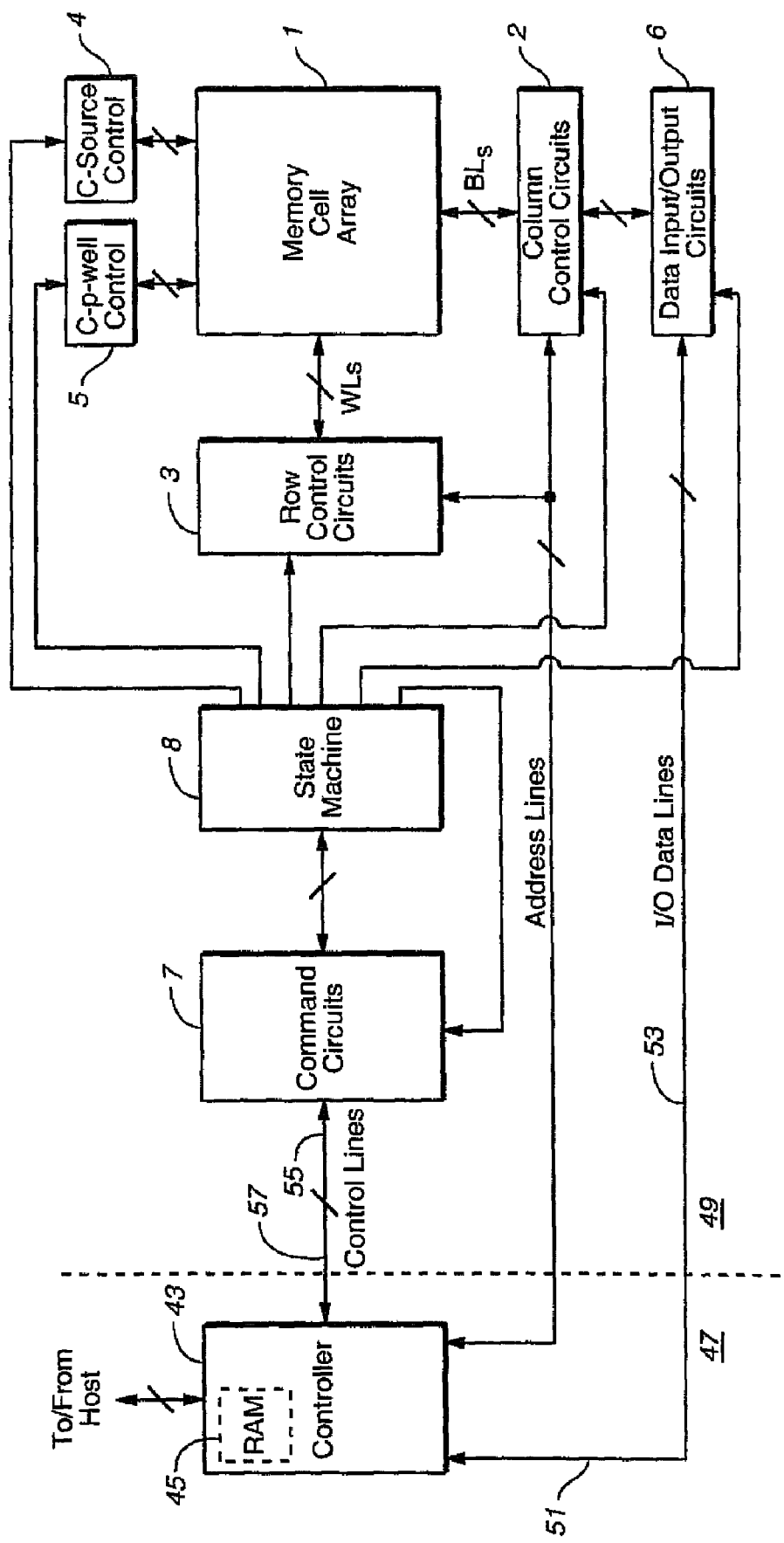
FIG._31

MULTI-STATE NON-VOLATILE INTEGRATED CIRCUIT MEMORY SYSTEMS THAT EMPLOY DIELECTRIC STORAGE ELEMENTS

CROSS-REFERENCE TO RELATED APPLICATIONS

This is a continuation of application Ser. No. 12/020,296, filed Jan. 25, 2008, now U.S. Pat No. 7,579,247, which is a continuation of application Ser. No. 11/075,427, filed Mar. 7, 2005, now U.S. Pat. No. 7,341,918, which in turn is a divisional of application Ser. No. 10/280,352, filed Oct. 25, 2002, now U.S. Pat. No. 6,925,007, which in turn is a continuation-in-part of application Ser. No. 10/161,235, filed May 31, 2002, now abandoned, which in turn is a continuation-in-part of application Ser. No. 10/002,696, filed Oct. 31, 2001, now U.S. Pat. No. 6,897,522, which applications are incorporated herein in their entirety by this reference.

FIELD OF THE INVENTION

This invention relates most specifically to non-volatile flash EEPROM (Electrically Erasable and Programmable Read Only Memory) cell arrays of a type using dielectric material charge storage elements.

BACKGROUND

There are many commercially successful non-volatile memory products being used today, particularly in the form of small cards, where the memory cells have conductive floating gates, commonly of doped polysilicon material, on which an electron charge is stored to a level of the data state being stored. A common form of such memory cells has a "split-channel" between source and drain diffusions. The floating gate of the cell is positioned over one portion of the channel and the word line (also referred to as a control gate) is positioned over the other channel portion as well as the floating gate. This effectively forms a cell with two transistors in series, one (the memory transistor) with a combination of the amount of charge on the floating gate and the voltage on the word line controlling the amount of current that can flow through its portion of the channel, and the other (the select transistor) having the word line alone serving as its gate. The word line extends over a row of floating gates. Examples of such cells, their uses in memory systems and methods of manufacturing them are given in U.S. Pat. Nos. 5,070,032, 5,095,344, 5,315,541, 5,343,063, and 5,661,053, and 6,281,075, which patents are incorporated herein by this reference.

A modification of this split-channel flash EEPROM cell adds a steering gate positioned between the floating gate and the word line. Each steering gate of an array extends over one column of floating gates, perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the floating gate to a desired level through an electric field (capacitive) coupling between the word line and the floating gate. It is often difficult to perform both of these functions in an optimum manner with a single voltage. With the addition of the steering gate, the word line need only perform function (1), while the added steering gate performs function (2). Further, such cells may operate with source side programming, having an advantage of lower programming currents and/or voltages. The use of steering gates in a flash EEPROM array is described in U.S. Pat. Nos. 5,313,421, 5,712,180, and 6,222,762, which patents are incorporated herein by this reference.

The foregoing incorporated references have their memory cells connected in what is generally referred to as a NOR configuration. The individual memory cells, which have one or two floating gate storage elements, are connected between adjacent bit lines to which adjacent cells in rows of cells are also connected. One bit line is connected to both source diffusions of one column of cells and drain diffusions of an immediately adjacent column of cells, in what is termed a virtual ground array. In another type of array architecture, generally referred to as a NAND configuration, eight, sixteen or more memory cells are connected in series with each other and select transistors in strings connected between individual bit lines and a common potential. Examples of such arrays and their operation are described in U.S. Pat. No. 6,046,935, which patent is expressly incorporated herein in its entirety by this reference.

There are various programming techniques for injecting electrons from the substrate onto the floating gate through the gate dielectric. The most common programming mechanisms are described in a book edited by Brown and Brewer, "Nonvolatile Semiconductor Memory Technology," IEEE Press, section 1.2, pages 9-25 (1998), which section is incorporated herein by this reference. One technique, termed "Fowler-Nordheim tunneling" (section 1.2.1), causes electrons to tunnel through the floating gate dielectric under the influence of a high field that is established thereacross by a voltage difference between the control gate and the substrate channel. Another technique, channel hot electron injection in the drain region, commonly referred to as "hot-electron injection" (section 1.2.3), injects electrons from the cell's channel into a region of the floating gate adjacent the cell's drain. Yet another technique, termed "source side injection" (section 1.2.4), controls the substrate surface electrical potential along the length of the memory cell channel in a manner to create conditions for electron injection in a region of the channel away from the drain. Source side injection is also described in an article by Kamiya et al., "EPROM Cell with High Gate Injection Efficiency," IEDM Technical Digest, 1982, pages 741-744, and in U.S. Pat. Nos. 4,622,656 and 5,313,421, which article and patents are incorporated herein by this reference. In a further programming technique, termed "ballistic injection", high fields are generated within a short channel to accelerate electrons directly onto the charge storage element, as described by Ogura et al., "Low Voltage, Low Current, High Speed Program Step Split Gate Cell with Ballistic Direct Injection for EEPROM/Flash", IEDM 1998, pages 987-990," which article is incorporated herein by this reference.

Two techniques for removing charge from floating gates to erase memory cells are used in both of the two types of memory cell arrays described above. One is to erase to the substrate by applying appropriate voltages to the source, drain, substrate and other gate(s) that cause electrons to tunnel through a portion of a dielectric layer between the floating gate and the substrate.

The other erase technique transfers electrons from the floating gate to another gate through a tunnel dielectric layer positioned between them. In the first type of cell described above, a third gate is provided for that purpose. In the second type of cell described above, which already has three gates because of the use of a steering gate, the floating gate is erased to the word line, without the necessity to add a fourth gate. Although this later technique adds back a second function to be performed by the word line, these functions are performed at different times, thus avoiding the necessity of making compromises to accommodate the two functions.

It is continuously desired to increase the amount of digital data that can be stored in a given area of a silicon substrate, in order to increase the storage capacity of a given size memory card and other types packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, a cell with sixteen states stores four bits of data, and so on. A multiple state flash EEPROM structure and operation is described in U.S. Pat. Nos. 5,043,940 and 5,172,338, which patents are incorporated herein by this reference.

Increased data density can also be achieved by reducing the physical size of the memory cells and/or of the overall array. Shrinking the size of integrated circuits is commonly performed for all types of circuits as processing techniques improve over time to permit implementing smaller feature sizes. But since there are limits of how far a given circuit layout can be shrunk by scaling through simple demagnification, efforts are so directed toward redesigning cells so that one or more features takes up less area.

In addition, different designs of memory cells have been implemented in order to further increase data storage density. An example is a dual floating gate memory cell connected in a NOR configuration, which can also be operated with the storage of multiple states on each floating gate. In this type of cell, two floating gates are included over its channel between source and drain diffusions with a select transistor in between them. A steering gate is included along each column of floating gates and a word line is provided thereover along each row of floating gates. When accessing a given floating gate for reading or programming, the steering gate over the other floating gate of the cell containing the floating gate of interest is raised sufficiently high to turn on the channel under the other floating gate no matter what charge level exists on it. This effectively eliminates the other floating gate as a factor in reading or programming the floating gate of interest in the same memory cell. For example, the amount of current flowing through the cell, which can be used to read its state, is then a function of the amount of charge on the floating gate of interest but not of the other floating gate in the same cell. An example of this cell array architecture, its manufacture and operating techniques are described in U.S. Pat. No. 5,712,180 (FIGS. 9+), which patent is incorporated herein by this reference (hereinafter referred to as the "Dual Storage Element Cell").

Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by this reference. The programming techniques mentioned above, by reference to section 1.2 of the book edited by Brown and Brewer, are also described in that section to be applicable to dielectric charge-trapping devices.

U.S. Pat. No. 5,851,881, incorporated herein by this reference, describes the use of two storage elements positioned adjacent each other over the channel of the memory cell, one being such a dielectric gate and the other a conductive floating gate. Two bits of data are stored, one in the dielectric and the other in the floating gate. The memory cell is programmed into one of four different threshold level combinations, representing one of four storage states, by programming each of the two gates into one of two different charge level ranges.

Another approach to storing two bits in each cell has been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

SUMMARY OF THE INVENTION

The present invention includes two primary aspects that may either be implemented together or separately. One primary aspect is directed to novel non-volatile memory cell structures that use dielectric charge storage elements rather than conductive floating gates. The other primary aspect is directed to the storage of charge in one of more than two detectable levels at one or more limited, contained regions across a dielectric charge storage element over a channel of a memory cell transistor. More than one bit of data is thereby stored in a single localized region of the dielectric over a portion of the channel. Two or more such independently programmable charge storage regions, spaced apart from each other along the length of the channel, may be provided in each memory cell of an array of such cells, wherein more than one bit of data is stored in each such region.

This invention can be implemented in a number of prior flash memory systems, such as those described above in the Background. Where a prior memory cell array utilizes conductive floating gates as storage elements, charge trapping dielectric material is substituted for the floating gates. The methods of making and operating such non-volatile memory systems with dielectric storage elements are quite similar to their conductive floating gate counterparts. Since charge does not move across a dielectric storage material, the dielectric may usually extend over most other areas of a memory cell array, across multiple rows and columns of memory cells. Where the memory cell includes a select transistor, however, gate dielectric is in one embodiment, substituted within the select transistor for the electron storage material.

Two or more electron storage elements can be provided within the storage dielectric of each memory cell that has a gate structure allowing independent control of the electric potential across the substrate surface in respective two or more portions along the length of the memory cell channel.

One or two independently programmed and read charge storage regions may be used within each dielectric electron storage element. The enlargement or movement of a region of the dielectric into which electrons are injected, which can occur as the number of erase/programming cycles increases, thus does not affect an adjacent region within the same memory cell. This increases the number of erase/programming cycles that the memory can endure, thus increasing its effective life.

In a particular example, the Dual Storage Element Cell described above in the Background has charge-storing dielectric substituted for each of the two floating gates of the memory cells. This dielectric is sandwiched between conductive steering gates and the substrate to form two functionally separate charge storage elements over channels of the memory cells between their sources and drains. One region of charge is preferably stored in each of these two storage elements, which lie along the length of the cell channels on opposite sides of the select transistors, although two such regions may alternatively be used to obtain a further increase in charge storage density. The level of charge in a region affects the threshold level of the portion of the length of the cell channel beneath that region. Two or more such charge levels, and thus two or more different threshold levels, are defined for programming into each of the two charge storage regions of each memory cell. Programming and reading of a selected one of the two charge storage regions of an addressed cell is accomplished in the same manner as in the dual floating gate systems, by turning on the select transistor and driving the other channel portion strongly conductive. This renders the selected charge storage region of the addressed cell responsive to voltages placed on its source, drain and gates. Specific examples of Dual Storage Element Cell arrays in which the charge storage dielectric may be substituted for floating gates are given in U.S. Pat. Nos. 6,091,633, 6,103,573 and 6,151,248, and in pending application Ser. No. 09/667,344, filed Sep. 22, 2000, by Yuan et al., entitled "Non-volatile Memory Cell Array having Discontinuous Source and Drain Diffusions Contacted by Continuous Bit Line Conductors and Methods of Forming," now U.S. Pat. No. 6,512,263; Ser. No. 09/925,134, filed Aug. 8, 2001, by Harari et al., entitled "Non-Volatile Memory Cells Utilizing Substrate Trenches," now U.S. Pat. No. 6,936,887; and Ser. No. 09/925,102, filed Aug. 8, 2001, by Yuan et al., entitled "Scalable Self-Aligned Dual Floating Gate Memory Cell Array and Methods of Forming the Array," now U.S. Pat. No. 6,762,092, which patents and patent applications are incorporated herein in their entirety by this reference.

Further inventive aspects of the Dual Storage Element Cell include providing a third dielectric storage element under the select gate of each memory cell in which a charge storage region is utilized. This allows three bits of data to be stored in each memory cell when each charge storage region is operated in two states (binary operation) but more data is stored in a single cell if some or all of the charge storage regions are operated in more than two states. Additionally, a memory cell array manufacturing process utilizing dielectric spacers in a mask to define widths of control (steering) gate lines may optionally be utilized to reduce one dimension of the memory cells in order to increase the data storage density of the array.

In another specific example, a NAND array has its memory cell floating gates replaced by storage element regions of a dielectric layer. This dielectric is sandwiched between word lines and the substrate surface. Otherwise, the array is operated as described in U.S. patent application Ser. No. 09/893,277, filed Jun. 27, 2001, now U.S. Pat. No. 6,522,580 which application is incorporated herein by this reference. Each storage element region may be operated to store more than two charge levels, thus storing more than one bit of data in each such region.

An improvement in the NAND array eliminates the usual metallurgical source and drain regions in the substrate between adjacent word lines and storage elements along lengths of NAND memory cell strings. Instead, the word lines and charge storage elements are packed closer together in a manner that practically doubles the density of the charge storage elements along the NAND strings. That is, additional word lines and charge storage elements are positioned in the spaces currently occupied by source and drain diffusions in NAND strings of memory cells. This improved array is operated in the same manner as a NAND array with memory cell source and drain regions.

Additional aspects, advantages and features of the present invention are included in the following description of its exemplary embodiments, which description should be read in conjunction with the accompanying drawings.

BRIEF DESCRIPTION OF THE DRAWINGS

FIG. 1 shows a plan view of a first example of an array of memory cells;

FIGS. 2A and 2B are cross-sectional views of the array of FIG. 1, taken at respective sections I-I and II-II;

FIG. 3 is an enlarged view of the section of FIG. 2A, showing one memory cell, plus exemplary threshold voltage characteristics across that cell;

FIG. 4 is a set of exemplary current-voltage characteristic curves for the memory cell of FIG. 3 operated in four states;

FIG. 5 is an equivalent electrical circuit of the memory cell shown in FIG. 3, plus schematic representations of some operating elements;

FIGS. 6A and 6B illustrate two different specific dielectric material configurations that may be used in memory cells for trapping charge;

FIG. 7 shows a plan view of a second example of an array of memory cells;

FIGS. 8A and 8B are cross-sectional views of the array of FIG. 7, taken at respective sections III-III and IV-IV;

FIG. 9 is an enlarged view of the section of FIG. 8A, showing one memory cell, plus exemplary threshold voltage characteristics across that cell;

FIG. 10 shows a plan view of a third example of an array of memory cells;

FIGS. 11A and 11B are cross-sectional views of the array of FIG. 10, taken at respective sections V-V and VI-VI;

FIG. 12 is an enlarged view of the section of FIG. 11A, showing one memory cell, plus exemplary threshold voltage characteristics across that cell;

FIG. 13 is a section that shows a modification of the memory cells shown in FIG. 11A;

FIG. 14 is a cross-sectional view of the array of FIG. 10, taken at section V-V thereacross, with a modification from what is shown in FIG. 11A;

FIG. 15 is an enlarged view of the section of FIG. 14, showing one memory cell, plus exemplary threshold voltage characteristics across that cell;

FIG. 16 is a schematic diagram of one gate connection embodiment of the arrays illustrated in FIGS. 10-15;

FIGS. 17-20 are cross-sectional views that illustrate steps of one process of forming the memory cell array illustrated in FIGS. 10-15;

FIG. 21 illustrates in block diagram form a flash EEPROM system in which the arrays of memory cells according to the first, second and third examples may be implemented;

FIG. 22 is a plan view of a fourth example of an array of memory cells;

FIGS. 23A and 23B are cross-sectional views of the array of FIG. 22, taken at respective sections VII-VII and VIII-VIII;

FIG. 24 is an electrical equivalent circuit of a string of memory cells of the fourth example;

FIGS. 25A, 25B and 25C illustrate one process for forming a memory array of the type illustrated in FIGS. 22-24;

FIGS. 26A, 26B, 26C and 26D illustrate another process for forming a memory array of the type illustrated in FIGS. 22-24;

FIG. 27 is a plan view of a fifth example of an array of memory cells;

FIG. 28 is a cross-sectional view of the array of FIG. 27, taken at section X-X thereof;

FIGS. 29A and 29B are views of the array of FIG. 27 across section X-X thereof, showing steps of a first processing embodiment;

FIGS. 30A and 30B are views of the array of FIG. 27 across section X-X thereof, showing steps of a second processing embodiment; and FIG. 31 illustrates in block diagram form a flash EEPROM system in which the array of memory cells according to the fourth and fifth examples may be implemented.

DESCRIPTION OF EXEMPLARY EMBODIMENTS

Several specific memory cell configurations are described with respect to the drawings. In each of them, charge is stored in at least one region of a charge trapping dielectric that is positioned between a conductive gate and the substrate. These memory cell examples may be operated either in a binary mode, where one bit of data is stored in each charge storage region, or in a multi-state mode, where more than one bit of data is stored in each charge storage region.

First Memory Cell Example (FIGS. 1-6)

A few cells of a two-dimensional array of cells is illustrated in FIG. 1 in plan view, with orthogonal sections shown in FIGS. 2A and 2B. Elongated, parallel source and drain diffusions 103, 104 and 105 are formed in a surface 101 of a semi-conductor substrate 100, with their lengths extending in the y-direction and are spaced apart in the x-direction. A dielectric layer 107 including a charge storage material is formed on the substrate surface 101. Elongated, parallel conductive control gates 109, 110 and 111 have lengths extending in the x-direction and are spaced apart in the y-direction. These gates can be made from doped polysilicon material, as is typical.

The charge storage elements of this simple structure (which is one of its advantages) are the areas of the dielectric layer 107 between the source and drain diffusions 103-105 and sandwiched between the control gates 109-111 and the substrate surface 101. These storage element areas are marked with cross-hatching in FIG. 1. The charge trapping material needs to be positioned only in these regions in order to form operable memory cells but may be extended over any other portions of the structure that is convenient, including over the entire memory cell array.

This memory cell array may be formed by standard processing techniques, particularly those developed for making flash EEPROM arrays of the type utilizing a floating gate. The major processing steps include forming an ion implant mask on the substrate surface through which ions are implanted into the source and drain regions 103-105. This mask is then removed and the dielectric layer 107 is formed over the entire array. A layer of conductive material, such as doped polysilicon or polycide, is then deposited over the dielectric 107, an etch mask formed on its top surface and the polysilicon is then etched through the mask to leave the control gates 109-111. In the case of polysilicon, these control gates are doped in order to make them conductive by either initially depositing the polysilicon in a doped form or subsequently doping it by implanting ions before it is separated into the elongated strips 109-111. When the polysilicon is etched, the layer 107 in the regions being etched may also be removed, since those regions are unnecessary to the operation of the memory, to leave strips of the dielectric layer 107 under the control gates 109-111. Finally, another implant may be made into the substrate between the control gate strips 109-111, using the control gates as a mask, in order to increase the electrical isolation between adjacent rows of cells.

The programming and charge retention of such an array is illustrated in FIG. 3, where a portion of FIG. 2A including a single memory cell is enlarged. Programming is accomplished by the channel hot-electron injection technique described above in the Background. When appropriate voltages are placed on the substrate 100, source 104, drain 105 and control gate 110, electrons are accelerated within the cell channel from the source toward the drain sufficiently to be injected into a region 115 within the dielectric layer 107 adjacent the drain 105 and retained there. The actual programming voltages applied depend upon details of the array structure but the following are exemplary: Substrate 100: 0 volts; source 104: 0 volts; drain 105: 5 volts; and control gate 110: 8 volts.

The preferred programming technique follows that of flash EEPROMs with conductive floating gates, as described in references discussed above in the Background. Simultaneous pulses of these programming voltages are periodically applied to a number of cells in parallel and the programmed states of the cells are read in between programming pulses. When an individual cell reaches its programmed level, application of programming pulses to that cell is terminated. It will be noted that the source and drain diffusions are shared between cells in adjacent columns, and are operated in a virtual ground mode that is widely used in the operation of floating gate memory arrays.

The length of the channel of the memory cell of FIG. 3 is noted to have two components, "L1" for the portion of the length outside of the charge storage region 115, and "L2" for the portion of the length under the region 115. A curve 117 illustrates the threshold voltage ($V_T$) characteristics of the channel. The curve is flat along the channel length segment L1 at a level depending upon any threshold altering implant that may have been made in the substrate surface 101 and the impact of any prior channel erase operations (described hereinafter). The charge stored in the region 115 does not affect the threshold characteristics in the L1 segment. But in the L2 channel segment, the threshold is significantly affected by the stored charge, and, as in the floating gate counterpart systems, is the characteristic that is measured to determine the storage state of the cell.

Programming by Fowler-Nordheim tunneling through the layer of oxide formed on the channel region has its limitations. It can usually be used in only some specific memory array configurations, such as NAND and AND configurations. It is not practical to program this first example, or either of the second or third memory cell array examples described hereinafter, by this technique. But if programmed in this manner, the storage region within the dielectric 107 would extend substantially uniformly across the entire channel length (L1+L2) instead of being confined to the region 115.

Each cell may be operated in binary, to store one bit of data, by detecting whether $V_T$ is above or below one predetermined threshold level. But according to one primary aspect of the present invention, more than one bit of data may be stored in each cell by operating it to distinguish between more than two levels or ranges of $V_T$ that are separated by more than two predetermined threshold levels. A window of threshold levels in the L2 segment is shown in FIG. 3 to be divided into four states 0-3, as an example, which will store two bits per cell. More than four levels may alternatively be designated in order to store more than two bits per storage element. Exemplary current-voltage characteristics are shown in FIG. 4 for the cell of FIG. 3 in each of its four storage states as a result of an appropriate amount of charge being stored in the dielectric region 115. The quantity $V_{CG}$ along the x-axis of FIG. 4 is the voltage on the control gate 110 of the cell, and the quantity $I_{CELL}$ on the y-axis is the current through the channel of the cell.

The memory cell shown in FIG. 3 is effectively a split-channel cell because the charge storage region 115 extends across only a portion of the channel. An electrical equivalent circuit of the cell is shown in FIG. 5, two transistors Q1 and Q2 being connected in series between adjacent source and drain diffusions 104 and 105 (bit lines). The transistor Q1 is rendered conductive during programming or reading by providing a sufficient combination of voltages on the cell's elements. During read, a voltage source 121 ($V_{CG}$) is connected to the control gate 110 (word line), a voltage source 125 ($V_S$) to the diffusion 104 and a voltage source 127 ($V_D$) to the diffusion 105.

The cell of FIG. 3 can be read in the same manner as a cell having a conductive floating gate. There are two general ways. The control gate voltage $V_{CG}$ may be held fixed and the current through the cell ($I_{CELL}$) measured by a sense amplifier circuit 129 as an indication of the storage state of the cell. The actual voltages applied depend upon details of the array structure but the following are exemplary: Substrate 100: 0 volts; source 104: 0 volts; drain 105: 1 volts; and control gate 110: 3-5 volts. Alternatively, the control gate voltage $V_{CG}$ may be varied and its value noted when the value of the cell current is determined by the sense amplifier 129 to cross a fixed threshold. That voltage value gives an indication of the storage state of the cell. This example utilizes "forward" reading, since the drain during programming is also the drain during reading. Alternatively, the reading may be performed in a "reverse" mode, where the drain and source during programming are reversed during reading.

The diagram of FIG. 5 also contains the components used to program the cell, except that the sense amplifier 129 is typically not connected during programming. The voltage sources 121, 125 and 127 are connected as shown in FIG. 5 during programming but the values of the voltages supplied are different. A number of cells along at least one word line may be erased together by applying appropriate voltages to cause electrons to move from the dielectric charge trapping regions to the substrate. An example set of erase voltages is as follows: Substrate 100: 0 volts; source 104: floating; drain 105: 5 volts; and control gate 110: −8 volts.

FIG. 6 illustrates two exemplary structures for the charge storage dielectric layer 107 that may be used in all of the memory cell examples described herein. The first (FIG. 6A) includes a layer 135 of silicon oxide ($SiO_2$), commonly just called "oxide," grown on the substrate surface 101, followed by a layer 137 of silicon nitride ($Si_3N_4$), commonly just called "nitride," being deposited over the layer 135. A layer 139 of oxide is then grown on the nitride layer 137 or deposited on it, or a combination of the two. This oxide-nitride-oxide configuration is known as "ONO." Electrons are trapped and stored in the nitride layer 137. Exemplary thicknesses of these layers are as follows: layer 135: 40-80 Angstroms; layer 137: 50-80 Angstroms; and layer 139: 50-100 Angstroms. The layer of conductive material from which the control gates are formed is then deposited on the ONO layer.

The second structure, shown in FIG. 6B, uses a tailored layer 141 of silicon rich silicon dioxide to trap and store electrons. Such material is described in the following two articles, which articles are incorporated herein in their entirety by this reference; DiMaria et al., "Electrically-alterable read-only-memory using Si-rich SI02 injectors and a floating polycrystalline silicon storage layer," J. Appl. Phys. 52(7), July 1981, pp. 4825-4842; Hori et al., "A MOSFET with Si-implanted Gate-Si02 Insulator for Nonvolatile Memory Applications," IEDM 92, April 1992, pp. 469-472. As an example, the thickness of the layer 141 can be about 500 Angstroms.

Second Memory Cell Example

Another example memory array is illustrated in FIGS. 7-9, which differs from the first example by the use of two sets of orthogonally positioned conductive gates instead of just one set. FIG. 7 shows a few cells of the array in plan view and FIGS. 8A and 8B are cross-sectional views in two orthogonal directions. Parallel source and drain diffusions 151, 152 and 153, formed in a surface 164 of a substrate 163, are elongated in the y-direction across the array and spaced apart in the x-direction. Conductive control gates 155, 156 and 157, which may be referred to as steering gates, are also elongated in the y-direction and spaced apart in the x-direction. These gates are positioned alongside respective diffusions 151, 152 and 153. These diffusions are spaced further apart than those of the first example in order to allow for these control gates to be positioned across the memory cell channels. A second set of conductive control gates 159, 160 and 161, which form the word lines of the array, are elongated in the x-direction and spaced apart in the y-direction. The conductive gates are typically formed of doped polysilicon but may alternatively be formed of other low resistance materials.

Referring to the sectional views of FIGS. 8A and 8B, a layer of charge storing dielectric 165 is formed over the substrate surface 164 of the array. This dielectric can be one of the two specific dielectrics described above with respect to FIGS. 6A-B. Another dielectric layer 167 is formed between the two sets of conductive gates where they cross each other. This layer is made to be relatively thick in order to sustain the potential voltage differences between the two sets of gates, such as a 250 Angstroms thick oxide.

It will be noted from FIG. 8A, and the enlarged sectional view of one memory cell thereof in FIG. 9, that the length of the individual memory cell channels is divided into two portions that are field coupled with different ones of the two sets of control gates. The word line 160 lies over the left approximately one-half of the channel length and the control gate 157 over the other. The charge storing dielectric 165 is sandwiched between the substrate surface 164 and these gates. A primary difference in operation of this array from that of the first example is that charge may be stored in two neighboring regions 171 and 173 within the layer 165, and each of these regions may be individually programmed and read independently of the other. Programming by source side injection is preferred, which causes the charge storage region 171 to be located adjacent an interior edge of the gate 160 and the charge storage region 173 adjacent an interior edge of the gate 157. However, if programmed by channel hot-electron injection, electrons are stored in regions 172 and 174 within the layer 165 instead of in the regions 171 and 173. The regions 172 and 174 are adjacent respective ones of the cell source and drain regions 152 and 153.

This example cell effectively contains two charge storage elements over its channel between adjacent source and drain regions 152 and 153, one under the conductive gate 160 and the other under the conductive gate 157. The dielectric layer 165 may be limited to these areas or, as is usually more convenient, extended over more of the array. FIGS. 7-9 show the charge storage layer 165 extending over the entire array.

A curve 175 of FIG. 9 illustrates the varying threshold voltage characteristics ($V_T$) across the cell's channel, when programmed in the regions 171 and 173 by source side injection. The amount of charge stored in the region 171 imparts a $V_T$ value 177 of the threshold under it, and the amount of charge stored in the region 173 imparts a $V_T$ value 179 of the threshold under it. Each of the threshold values 177 and 179 may be maintained in one of two storage states, where a single breakpoint threshold value is set between the states. Two bits of data are stored in each cell if this is done. Alternatively, each of the values 177 and 179 may be operated with more than two levels, as shown in FIG. 3 for the first example array. If each of the levels 177 and 179 is operated in four states, as shown in FIG. 3, a total of four bits of data are stored in each memory cell. Of course, if one or both portions of the channel are operated in more than four levels, more than four bits of data are stored in each cell. In order to assure separation of the charge storage regions 171 and 173, a portion of the dielectric layer 165 between them can be removed and replaced with a thermal oxide or other relatively non-trapping dielectric. Also, if the cell is programmed by channel hot-electron injection instead of source side injection, the levels 178 and 180 of the curve show the threshold voltage effect of the charge storage regions 172 and 174. Alternatively, all four charge storage regions 171-174 may be utilized by programming with both source side injection and channel hot-electron injection in sequence, in order to further increase the amount of data stored in each memory cell.

Each of the threshold values 177 and 179 is preferably programmed and read independently of one another. One segment of the cell is turned on hard, thus eliminating any effect of its programmed threshold level, while the other is being programmed or read. Although the specific voltages applied to the array will depend upon its specific structure, the following are approximate voltages that might be used for programming the cell of FIG. 9 by source side injection:

Programming the left segment, region 171: Substrate 163: 0 volts; source 153: $V_S$=0 volts; drain 152: $V_D$=5 volts; word line 160: $V_{WL}$=8 volts; and control gate 157: $V_{SG}$=the threshold $V_T$ 179 of the device on the right side plus about 1 volt.

Programming the right segment, region 173: Substrate 163: 0 volts; source 152: $V_S$=0 volts; drain 153: $V_D$=5 volts; control gate 157: $V_{SG}$=8.8 volts; and word line 160; $V_{WL}$=the threshold $V_T$ 177 of the device on the left side plus about 1 volt.

Approximate voltages for programming by channel hot-electron injection can be, for example, as follows:

Programming the left segment, region 172: Substrate 163: 0 volts; source 153: $V_S$=0 volts; drain 152: $V_D$=5 volts; control gate 157: $V_{SG}$=8 volts; and word line 160: $V_{WL}$=8 volts.

Programming the right segment, region 174: Substrate 163: 0 volts; source 152: $V_S$=0 volts; drain 153: $V_D$=5 volts; control gate 157: $V_{SG}$=8 volts; and word line 160: $V_{WL}$=8 volts.

Programming is also preferably accomplished in this example by alternately pulsing a plurality of cells with these voltages in parallel and verifying their programmed states by reading them, the programming being terminated on a cell-by-cell basis after reaching the desired level, as done with floating gate flash memory gate arrays.

Exemplary reading voltages for the cell of FIG. 9, when only regions 171 and 173 have been programmed in the manner described above, are as follows:

Reading the left region 171, threshold value 177, 0 volt is applied to substrate 163 and source 152, drain 153 is held at a low voltage (such as 1 volt), and the select gate 157 is held at a sufficiently high voltage to ensure region 173 is conducting when programmed to its highest threshold state. The voltage of the word line 160 is then varied, and the bit line current monitored to detect the threshold of the region 171.

Similarly, reading the right region 173, threshold value 179, 0 volt is applied to substrate 163 and source 153, drain 152 is held at a low voltage, and the word line 160 is held at a high voltage. The voltage of the select gate is then varied, and the bit line current monitored to detect the threshold of the region 173.

Exemplary reading voltages for the cell of FIG. 9, when only charge storage regions 172 and 174 have been programmed in the manner described above, can be given as follows:

Reading the left region 172, threshold value 178, 0 volt is applied to substrate 163 and source 152, 8 volts is applied to select gate 157, and a low voltage (such as 1 volt) is applied to drain 153. The voltage of the word line 160 is then varied, and the bit line current monitored to detect the threshold of the region 172.

Reading the right region 174, threshold value 180, 0 volt is applied to substrate 163 and source 153, 8 volts is applied to word line 160, and approximately 1 volt is applied to drain 152. The voltage of the select gate 157 is then varied, and the bit line current monitored to detect the threshold of the region 174.

When all four regions 171-174 are programmed with charge, they can be read one at a time as follows:

Reading charge storage regions 172 and 174, reading proceeds as described above.

Reading region 171, 0 volt is applied to substrate 163 and source 153, select gate 157 is held at a sufficiently high voltage to ensure regions 173 and 174 are conducting when programmed to their highest threshold states, and a voltage sufficient to deplete through region 172 is applied to drain 152 (approximately 3 volts). The voltage of the word line 160 is then varied, and the bit line current monitored to detect the threshold of the region 171.

Reading region 173, 0 volt is applied to substrate 163 and source 152, word line 160 is held at a sufficiently high voltage to ensure regions 171 and 172 are conducting when programmed to their highest threshold states, and a voltage sufficient to deplete through region 174 is applied to drain 153 (approximately 3 volts). The voltage of the select gate 157 is then varied, and the bit line current monitored to detect the threshold of the region 173.

Additionally, in order to allow such reading of all four regions, the charge level of states programmed into each pair of regions (left pair 171 and 172, and right pair 173 and 174) should be constrained to have a given relationship to each other. One such relationship is that the outer charge storage region of each pair, namely region 172 for the left pair and region 174 for the right pair, is given a level of charge resulting in a sufficiently higher threshold voltage ($V_T$) than the respective inner region 171 or 173 of the pair (for example, approximately one state level higher). This then allows reading the threshold values in each of the two regions under a single gate in the manner described above, with the given constraint of some threshold value combinations not utilized. This is because the inner regions' thresholds are not programmed to values that equal or exceed the outer regions' thresholds.

An example is useful to illustrate this. Five programmed threshold level ranges can be designated, from a low of 0, then 1, 2, 3 in order and with 4 as the highest. Four of these are used in each of the charge storage regions 171-174, an upper set of threshold levels 1-4 for each of the outer regions 172 and 174 and a lower set of 0-3 for the inner regions 171 and 173. Ten storage states may then be designated for each charge storing pair from the permitted combinations of threshold voltages of the individual charge storage regions, as follows:

| State | Outer Region $V_T$ | Inner region $V_T$ |
|---|---|---|
| 0 | 1 | 0 |
| 1 | 2 | 0 |
| 2 | 3 | 0 |
| 3 | 4 | 0 |
| 4 | 2 | 1 |
| 5 | 3 | 1 |
| 6 | 4 | 1 |
| 7 | 3 | 2 |
| 8 | 4 | 2 |
| 9 | 4 | 3 |

Thus, a total of 10 different states are detectable on each side of the memory cell shown in FIG. 9, by providing for the detection of 5 different charge (threshold) levels in each region, resulting in 100 different storage state combinations for the memory cell. Of course, use of a fewer number of threshold levels will result in a fewer number of detectable states, and an increase in the number of threshold levels will provide additional storage states.

There is also a preferred order of programming the threshold levels in each of the four regions. Namely, both inner regions 171 and 173 are programmed before programming the outer regions 172 and 174. Region 173 is first programmed by source side injection in each cell of a row of such cells that share a common word line. Regions 171 are then similarly programmed along the row, with a voltage $V_{SG}$ placed on their individual control gates 157 that is dependent on the level of charge that has been programmed into the regions 173 under them, in order to enable source side injection. The regions 172 and 174 are then programmed in either order by hot-electron injection.

Erasing of the memory cells is accomplished in this example and the other two examples by the injection of holes into their charge trapping layers and/or by extracting the electrons from the charge trapping layers. The holes neutralize the negative charge of the electrons that were injected into the charge-trapping layer during a programming operation. It is the layer 165 in this second example (FIGS. 7-9) that receives the electrons during programming and the holes during erasing. There are two specific erasing techniques. In one, the holes are injected into a charge storage portion of the layer 165 from the silicon substrate by tunneling through an oxide portion of that layer that is in contact with the substrate surface, termed a "channel erase." In the same approach, some of the electrons stored in the charge storage portion of the layer 165 can be extracted by the tunneling mechanism through the oxide portion of the layer 165 to the silicon surface. To bring this about, a negative potential is applied to the word line, as well as the select gate in the case of the cell of FIG. 9, with respect to the substrate, with the drain and source either being grounded or left floating. In the other technique, the holes are injected into the layer 165 from a region of the substrate near the drain or the source and/or electrons are extracted by tunneling between the layer 165 and the source and drain regions. In this second approach, referring to FIGS. 8 and 9, a combination of a negative voltage on both the word lines 159-161 and steering gates 155-157, and a positive voltage on the drains and sources 151-153, are applied. (In the cell shown in FIG. 3 for the first example previously described, a positive voltage is applied to the drain 105, the source 104 is left floating, and a negative voltage is applied to the word line 110.) This second erasing approach is not used when inner storage regions 171 and 173 of the cell of FIG. 9 are in use.

When cells have been programmed by source side injection, the channel erase technique is used. When only storage regions programmed by the hot-electron injection technique are used, either of these two erasing techniques can be used. But when cells have been programmed by hot-electron injection, the channel erase has a disadvantage of tunneling holes and/or electrons across the entire channel, the result being an over erase of a portion of the charge trapping layer that does not contain electrons trapped by prior programming. This can cause the flat zero portions of the curve 175 (FIG. 9) across the cell channel to be lowered to negative threshold values.

To simultaneously erase a plurality of cells in a block of cells in this second example, the following voltages are simultaneously applied to individual cells: Substrate 163: 0 volt; source 152: $V_S$=5 volts; drain 153: $V_D$=5 volts; control gate 157: $V_{SG}$=−8 volts; and word line 160: $V_{WL}$=−8 volts. These voltages implement the second erase approach described above.

The memory cell array of FIGS. 7-9 may also be formed by standard processing techniques, particularly those developed for making flash EEPROM arrays of the type utilizing a floating gate. In one example process, the layer 165 is first formed over the entire substrate area of the memory cell array. A first layer of polysilicon is then deposited over this area and etched through an appropriate mask to leave the control gates 155-157. The layer 165 in between the control gates 155-157 is removed as part of this etching process, in one example. The source and drain regions 151, 152 and 153 are then implanted through a mask formed by the control gates and other temporary masking material (not shown), thus being self-aligned with one edge of the control gates 155-157. The layer 165 is then formed on the substrate surface 164 in between the control gates 155-157 and simultaneously over the top and sides of the control gates 155-157. This is a continuous layer of ONO (FIG. 6A) or silicon rich oxide (FIG. 6B). The layer 167 shown in FIGS. 8 and 9 can be part of the same layer 165 or a combination of the layer 165 and other dielectric material. Such other dielectric material can be in the form of oxide spacers (not shown) formed along the vertical walls of the control gates 155-157 and/or a thick oxide layer (not shown) on the top surface of the control gates 155-157. This top surface oxide is preferably formed by depositing the oxide on the top of the first polysilicon layer before it is separated into the gates 155-157. A second layer of polysilicon is then formed over this continuous layer, and is then etched into the word lines 159, 160 and 161.

It will be noted that this second example memory cell has a larger dimension in the x-direction by one resolution element than does the first example of FIGS. 1-3, because of the added control (steering) gates 155-157. A second polysilicon layer is also required in this second example. This added structure and size, however, allows the amount of data that is stored in each cell to be doubled.

A useful modification of the cell of FIGS. 7-9 for some purposes replaces the electron storage layer under the control gates 155-157 with a thin (such as 200 Angstroms thick) gate dielectric, usually an oxide grown on the substrate surface 164. This eliminates the second electron storage region 173 but adds an independent select transistor function to each cell. Erase can then be confined to individual rows of cells.

Third Memory Cell Example

In this example, shown in FIGS. 10-13, an array of Dual Storage Element Cells, described above in the Background, is provided with its conductive floating gates replaced by portions of one of the dielectric charge trapping material layers described above with respect to FIGS. 6A-6B. The making and operation of this array are similar to the arrays of Dual Storage Element Cells described in the patents and patent applications incorporated above into the Background and Summary.

FIGS. 10-12 show an array. Source and drain diffusions 185, 186 and 187 are formed in a surface 181 of a semiconductor substrate 183, and have their lengths extending in the y-direction and are spaced apart in the x-direction. As apparent from the plan view of FIG. 10, conductive steering gates 189, 190, 191, 192, 193 and 194 are oriented in the same way as the diffusions, being positioned on either side of the diffusions in the x-direction. Conductive word lines 197-199 are oriented with lengths extending in the x-direction and are spaced apart in the y-direction. As is typical, these conductive lines are made of doped polysilicon material.

The word fines 197-199 are preferably formed from a single deposited layer of conductive material, rather than as two pieces formed one on top of the other at different stages of the process, in order to avoid extra processing steps. However, such a two piece structure can be an advantage when doped polysilicon lines have less conductivity than desired for word lines, in which case a second piece of a material with a higher conductivity can be added in contact with top surfaces of the doped polysilicon lines. Such a material may be silicide or a metal, as two examples.

As illustrated in the sectional views of FIGS. 11A and 11B, the steering gates 189-194 are positioned over a layer 201 of charge storage material according to one of FIGS. 6A-6B. After the steering gates 189-194 are formed over the charge storing layer 201, strips of that layer extending in the y-direction are removed between every other of the steering gates in the x-direction. The source and drain regions 185-187 are implanted between the remaining regions between every other steering gate in the x-direction. An oxide layer 203 is formed over the tops and sides of the steering gates 189-194 to isolate those steering gates from the word lines 197-199, and simultaneously formed over the exposed substrate surface 181 to provide gate oxide under the word lines 197-199. An example thickness of the dielectric layer 203 is 200 Angstroms over the doped polysilicon steering gates 189-194, and 150 Angstroms on the substrate surface 181. The portions 198' of the word line 198 shown in FIG. 11A, for example, that are formed immediately over the portion of the oxide layer 203 on the substrate surface 181, serve as the select transistor gates in that row of memory cells.

Adjacent pairs of steering gates on either side of the diffusions 185-187 are preferably electrically connected together at a decoder for the steering gates in order to reduce the complexity of the decoder. One such pair includes steering gates 191 and 192. Such adjacent pairs of steering gates may alternatively be physically merged together by joining them over their intermediate diffusions, as described in several of the Dual Storage Element Cell patents and applications referenced above.

Individual storage elements can be defined to exist in regions of the dielectric trapping layer 201 under one of the steering gates 189-194 where one of the word lines 197-199 crosses, as shown in cross-hatching in the plan view of FIG. 10. There are two such storage elements per memory cell. One charge storage region can be operated in each storage element in two states (binary) in order to store 1 bit per storage element. The charge storage regions may alternatively be operated to individually store more than two states, such as four states per region, in a manner similar to that described in the Dual Storage Element Cell U.S. Pat. No. 6,151,248. The operation of such a dielectric storage memory array is similar to what is described in that patent, one difference being the use of lower voltages on the steering gates since there are no floating gates.

With reference to FIG. 12, an enlarged view of one of the memory cells of FIG. 11A is given. The cell can be operated to trap charge within the dielectric layer 201 in two regions 211 and 213, adjacent to each side of a select transistor gate 198' that is part of the word line 198, by programming with the source-side injection technique. If programmed by the channel hot-electron injection technique, on the other hand, charge storage regions 212 and 214 are located adjacent respective source and drain regions 186 and 187 instead. Alternatively, all four of the charge storage regions 211-214 may be utilized by sequentially programming them with the source-side injection and hot-electron injection techniques, each region either in two-states or more than two-states, as limited by the same considerations of threshold relationships that are discussed above with respect to the example of FIG. 9, but without the constraint of writing order sequence. The portions of the dielectric 201 within the memory cell on either side of the select transistor gate 198' and beneath the word line 198 define the two storage elements of the cell that replace the two conductive floating gates of the Dual Storage Element Cell arrays and systems referenced above. The dielectric layer 201, however, can extend beyond these storage elements. In one form, the layer 201 is formed in strips having individual widths that extend in the x-direction between select transistors of memory cells in adjacent columns and lengths that extend in the y-direction across a large number of rows of memory cells. These strips, and the select transistor gate dielectric between them, can be self-aligned with edges of the steering gates, such as the edges of the steering gates 192 and 193 that are shown in FIG. 12.

The effect of charge stored in the regions 211 and 213 of the dielectric 201 is shown by portions 217 and 219 of a threshold voltage curve 215 in FIG. 12, similar to the other two examples described above, when programmed by source side injection. Source side programming differs in this cell from that of FIG. 9 by moving the terminal which supplies the threshold plus 1 v bias condition. In FIG. 12 this terminal is the word line 198 connected to the select gate 198' for both storage regions 211 and 213. In addition, the steering gate above the storage regions not being programmed are now driven to a sufficiently high over-drive voltage level (for example 8 volts). For example when storage region 211 is being programmed, steering gate 193 is driven to the over-drive voltage, and word line 198 is driven to about 1 volt above the threshold voltage of select transistor 198'.

The curve portion 217 of FIG. 12 indicates a variation of the threshold voltage $V_T$ of a portion of the memory cell channel under the charge region 211. Similarly, the effect of the charge region 213 on the channel is indicated by the portion 219 of the curve 215. Each of these regions may be operated in two states (storing one bit per cell) or more than two states (storing more than one bit per cell), as previously described above for the other examples. If programmed by channel hot-electron injection, charge is stored in the regions 212 and 214, the effect on threshold voltage being illustrated by respective portions 216 and 218 of the curve 215 of FIG. 12. Each of the regions 212 and 214 can be operated in either two or in more than two defined states. During such programming, all three gates, 192, 193 and 198' are driven to high overdrive voltages (for example, all three taken to 8 volts). When data dependent charge is stored in each of the four regions 211-214, the cell storage capability is the same as described with that of FIG. 9. Erasing the storage regions of FIG. 12 follows that for erasing the storage regions in FIG. 9, as previously described.

FIG. 13 shows an optional modification of the memory cell shown in cross-section of FIGS. 11A and 12. The difference is that the select gate portion of the word line 198' extends into a groove or recess 221 in the substrate 183, with the select transistor gate dielectric 205 formed between them along the bottom and walls of the groove 221. This structure increases the length of the channel of the select transistor without taking any additional area across the substrate surface 181.

Although the gates in the foregoing structure are preferably made of doped polysilicon material, other suitable electrically conductive materials may be used in place of one or both of the polysilicon layers described. The second layer, for example, from which the word lines 197-199 are formed, may be a polycide material, which is polysilicon with a conductive refractive metal silicide, such as tungsten, on its top surface in order to increase its conductivity. A polycide material is usually not preferred for the first conductive layer from which the steering gates 189-194 are formed because an oxide grown from a polycide as an interpoly dielectric is of lower quality than that grown from polysilicon. The same considerations apply for the second memory cell example described above. For the first memory cell example, since only one layer of conductive gates is formed, those gates may be a polycide material.

A variation of the structure shown in FIG. 11A across section V-V of FIG. 10 is given in FIG. 14, where the same reference numbers are used. The primary difference is that a charge trapping dielectric layer 204 is positioned under the select gates that are part of the word lines 197-199 to form another charge storage region that further increases the data storage capacity of a single memory cell without increasing its size That is, the relatively non-trapping select gate dielectric 203 (FIG. 12) and 205' (FIG. 13) between the substrate surface 181 and the select gate 198' is replaced with a charge storage dielectric layer 204, as best shown in the enlarged view of FIG. 15. This forms another charge storage region 401 in the dielectric layer 204. As shown in the threshold voltage curve 215 of FIG. 15, a curve portion 403 indicates the effect on the memory cell channel of the charge storage region 401. The region 401 is preferably programmed by Fowler-Nordheim tunneling of electrons from the substrate 183, and is thus substantially coextensive with the select gate 198'. The region 401 may be operated in two states (storing one additional bit of data) or in more than two states (storing more than one additional bit). When combined with the separate charge storage regions 211 and 213, the single memory cell illustrated in FIG. 15 is then able to stores many bits of data.

It is also possible to operate the individual memory cells of FIGS. 14 and 15 with the two additional charge storage regions 212 and 214, thus providing five charge storage regions in each memory cell. This is possible since there are three different programming mechanisms that may be used to store charge in these different regions: source side injection for the regions 211 and 213, hot-electron injection for the regions 212 and 214 and Fowler-Nordheim tunneling for the region 401. Each of these five regions may be operated in two-states (one cell then stores five bits of data) or in more than two-states (one cell stores more than five bits of data), or with one or more of the five regions operated in two-states (binary) and the remaining regions operated in more than two-states (multi-state), with the state limitations on regions 211, 212, 213 and 214 as described in relation to corresponding charge storage regions of the cell of FIG. 9.

With reference to FIG. 15, the three charge storage regions 211, 213 and 401 of an erased memory cell are programmed in sequence. When erased, the threshold curve 215 is flat across all of the storage regions, at zero volts (not shown). The regions 211, 212, 213 and 214 of an erased cell are first programmed as described above with respect to FIG. 12. For storage regions 211 and 213, programmed by source side injection, the voltage on the word line 198 is held to a value just slightly above the erased threshold of storage region 401 to promote source side injection. The middle region 401 is then programmed by Fowler-Nordheim tunneling, for example, by holding the substrate 183 at about 0 volts, and placing either of the source and drain regions 186 or 187 at about zero volts and raising the select gate 198' to the programming potential of about 10-12 volts. In order to pass this zero volt bias level, the steering gate 192 or 193 corresponding to the zero volt driven source or drain region is biased to a sufficient overdrive voltage above the highest possible stored threshold level (for example, about 6 volts). At the same time the other steering gate of the 192, 193 pair is biased to maintain cutoff between its associated source or drain and this middle region 401 (for example, about 0 volts). If the region 401 is being programmed into more than two states, the voltage of the select gate 198' can be varied accordingly. When programming has been completed in one cell within a row of cells, further programming of that cell is inhibited by raising its source or drain region from the zero volt programming level to about a 5 volt inhibit level. In this way, programming is terminated on this cell while continuing the programming of other cells along the same row.

The charge level states of the charge storage regions 211 and 213 are read in the same manner as corresponding regions of the examples of FIG. 12 with the voltage on the word line 198 held at about 8 volts. The charge level of the middle storage region 401 is then read by keeping the substrate 183 at about 0 volts, placing a voltage on one of the source and drain regions 186 and 187 of 0 volts and the other at about 1 volt, and the steering gates 192 and 193 of about 8 volts. The voltage on word line 198 is varied and bit line current monitored to detect the threshold 403 of the charge storage region 401. Erasing the sub-steering gate storage regions 211, 212, 213 and 214 of FIG. 15 follows that for erasing the storage regions in FIG. 12, as previously indicated. Erasing storage region 401 in FIG. 15 is done by channel erasing, for example by applying a sufficiently large negative voltage to word line 198.

Because of the above use of different steering gate voltage levels imposed on the two steering gates during programming of the middle region 401 of the memory cells of FIG. 15, this requires that the voltage on each of the control (steering) gates, as exemplified by elements 189-194 of the array in FIG. 10, be independently controllable. Since it is usually impractical to provide, on the same circuit chip as the array, such a large decoder as required to handle the number of steering gates of a large array, they are preferably connected together in a manner schematically illustrated in FIG. 16 for a few memory cells of one row. Such a connection is further described with respect to FIG. 6 of afore-referenced U.S. patent application Ser. No. 09/871,333, filed May 31, 2001, now U.S. Pat. No. 6,532,172. Every fourth steering gate along the row is connected to a common steering gate line, in this example, which allows the simultaneous programming and reading of one charge storage region of every other cell along the row. A steering gate line 411 is connected to steering gate 191 and others, line 412 to gate 192 and others, line 413 to gates 189, 193 and others, and line 414 to steering gates 190, 194 and others. The word line 198 is connected with the select gate of each of the cells in the row, including select gates 198' and 198''. Other rows in the array similarly have distinct word lines.

In operation, referring to FIG. 16, when the charge storage regions under steering gates 190, 194 and others connected with the line 414 are being programmed, a high programming voltage is placed on the line 414, and a by-pass voltage is placed on the line 411 that is sufficient to render conductive regions in the channel under the steering gate 191 and others connected to the line 411. A sufficiently low voltage (for example a negative voltage of a few volts) is placed on the lines 412 and 413, connected to steering gates in the intermediate cells not being programmed, in order to suppress any current that might otherwise flow through the unselected intermediate cells. The word line 198 is set to an appropriate voltage, as discussed above with respect to FIG. 15. In this way all the even numbered cells along a word line can be programmed or read in a first pass, consisting of up to five separate programming operations of the corresponding up to five storage regions, and likewise all the odd numbered cells along the same word line can be programmed or read in a second pass.

An example process for forming the array of memory cells described above with respect to FIGS. 10-13, but with an increased storage density in the x-direction, is illustrated in the views of FIGS. 17-20. These views are taken along a section in the x-direction of an array and show a sequence of processing steps.

A first series of processing steps illustrated in FIG. 17 includes forming a layer 419 of ONO or other charge trapping dielectric on a surface 421 of a substrate 423 over an area of the substrate in which array is to be formed. Next, a layer 425 of doped polysilicon is deposited on the layer 419 in this area. The deposition of a layer 427 of silicon nitride over the polysilicon follows this. An etch mask is next formed over the nitride layer strips 427 with photoresist strips 429 having lengths extending in the y-direction and spaced apart in the x-direction. The pitch of these strips in the x-direction is usually made as small as the resolution capabilities of the lithography used to expose the photoresist.

A next series of processing steps may be described with respect to FIG. 18. The nitride layer 427 is isotropically etched away between the mask elements 429 (FIG. 17) to leave portions of the nitride under the mask elements, namely strips 427 extending in the y-direction, FIG. 18 showing them across the x-direction of the array. The width of the resulting strips 427 is made smaller than that of the photoresist mask strips 429 by an undercutting process during the nitride etch. A thick layer of silicon dioxide is then deposited over the structure to fill in between the nitride strips 429 and over them. This oxide is then anisotropically etched to leave spacers 431 along the sidewalls of the nitride strips 427 and with spaces between them in the x-direction that have a dimension less than the minimum lithographic dimension of the process. Control of the height of the nitride layer 427 and the thickness of the deposited silicon dioxide are used to control the width of the spacers 431 as well as the space between them.

The polysilicon layer 425 is then etched through the spaces between the oxide spacers 431, typically including etching any field isolation that might exist between the strips in the y-direction to result in continuous trenches extending in the y-direction. This leaves strips 425' of polysilicon that extends continuously in the y-direction. Although the charge trapping dielectric layer 419 between the segments 425' may also be removed through this mask, it need not be and remains in FIG. 19. In either case, source and drain regions 433 are then implanted through these trenches into the substrate 423 by directing ions against the structure. The source and drain regions then extend continuously in the y-direction across the array. The oxide spacers 431 are then removed by a selective etch process. A thick layer of silicon dioxide is thereafter deposited into the trenches and over the remaining nitride strips 427. This oxide is then removed by a chemical-mechanical-polishing (CMP) process down to tops of the nitride strips 427, using the nitride as CMP stops. Oxide fill portions 435 between the polysilicon segments 425' and nitride strips 427 are the result.

In a next series of steps illustrated by FIG. 20, the nitride 427 is removed by a selective etch that leaves the oxide fill portions 435 substantially in place. A further etch of the polysilicon is then performed through resulting openings between the oxide portions 435. This leaves doped polysilicon control (steering) gates 425'', which have lengths extending in the y-direction. Areas of the charge trapping dielectric 419 exposed between these gates are also removed. Next, a layer 437 of oxide is grown or deposited (or both) to serve as a select gate dielectric in regions under select gates to be formed, and as insulation between the steering gates and the word lines to be formed. Those word lines, such as a line 439, are formed by depositing a second layer of doped polysilicon over the area of the array and removing it through a mask that leaves word line strips with lengths extending in the x-direction and which are spaced apart in the y-direction.

The primary advantage of the structure of FIG. 20 compared with that of FIG. 11A is the compactness along the x-direction. Consequently, the number of charge storage regions in a row of a given length is increased significantly, up to a factor of two.

Memory System Operation, in General

An example memory system in which the various aspects of the present invention may be implemented is generally illustrated in the block diagram of FIG. 21. This system is most specifically directed to use of the second and third example arrays discussed above with control (steering) gates elongated in the y-direction but also has application to the first example by elimination of the circuits that connect to steering gates.

A large number of individually addressable memory cells 11 are arranged in a regular array of rows and columns, although other physical arrangements of cells are certainly possible. Bit lines, designated herein to extend along columns of the array 11 of cells, are electrically connected with a bit line decoder and driver circuit 13 through lines 15. Word lines, which are designated in this description to extend along rows of the array 11 of cells, are electrically connected through lines 17 to a word line decoder and driver circuit 19. Steering gates, which extend along columns of memory cells in the array 11, are electrically connected to a steering gate decoder and driver circuit 21 through lines 23. The steering gates and/or bit lines may be connected to their respective decoders by techniques described in a co-pending patent application by Harari et al. entitled "Steering Gate and Bit Line Segmentation in Non-Volatile Memories," Ser. No. 09/871,333, filed May 31, 2001, now U.S. Pat. No. 6,532,172, which application is incorporated herein by this reference. Each of the decoders 13, 19 and 21 receives memory cell addresses over a bus 25 from a memory controller 27. The decoder and driving circuits are also connected to the controller 27 over respective control and status signal lines 29, 31 and 33. Voltages applied to the steering gates and bit lines are coordinated through a bus 22 that interconnects the steering gates and bit line decoder and driver circuits 13 and 21.

The controller 27 is connectable through lines 35 to a host device (not shown). The host may be a personal computer, notebook computer, digital camera, audio player, various other hand held electronic devices, and the like. The memory system of FIG. 21 will commonly be implemented in a card according to one of several existing physical and electrical standards, such as one from the PCMCIA, the CompactFlash™ Association, the MMC™ Association, and others. When in a card format, the lines 35 terminate in a connector on the card that interfaces with a complementary connector of the host device. The electrical interface of many cards follows the ATA standard, wherein the memory system appears to the host as if it was a magnetic disk drive. Other memory card interface standards also exist. Alternatively to the card format, memory systems of the type shown in FIG. 21 are permanently embedded in the host device.

The decoder and driver circuits 13, 19 and 21 generate appropriate voltages in their respective lines of the array 11, as addressed over the bus 25, according to control signals in respective control and status lines 29, 31 and 33, to execute programming, reading and erasing functions. Any status signals, including voltage levels and other array parameters, are provided by the array 11 to the controller 27 over the same control and status lines 29, 31 and 33. A plurality of sense amplifiers within the circuit 13 receive current or voltage levels that are indicative of the states of addressed memory cells within the array 11, and provides the controller 27 with information about those states over lines 41 during a read operation. A large number of such sense amplifiers are usually used in order to be able to read the states of a large number of memory cells in parallel. During reading and program operations, one row of cells is typically addressed at a time through the circuits 19 for accessing in the addressed row a number of cells that are selected by the circuits 13 and 21. In one embodiment, during an erase operation, all cells in each of many rows are addressed together as a block for simultaneous erasure.

The memory cell array of the system of FIG. 21 is desirably divided into segments. As will be noted from the second and third examples described above, the sources, drains and steering gates can extend without limit across the entire array in the y-direction unless segmented. These dielectric arrays may be divided into segments that each extends only a portion of the distance across the full array in the y-direction. The sources and drains at an end of a segment are connected through switching transistors to global bit lines, normally made of metal. The steering gates may be similarly connected through switching transistors to global steering lines. Alternatively, the steering gates may be connected to steering gate line bussing associated with the segment, in the manner previously described with respect to FIG. 16. During programming, reading or erasing operations, one selected segment is usually connected to a set of global bit lines at a time, as well as to either a set of global steering lines or to associated steering gate line bussing, depending upon the segmentation embodiment being used. Such segmentation is described with respect to FIG. 10C of aforementioned U.S. Pat. No. 5,712,180, and in U.S. patent application Ser. No. 09/871,333, filed May 31, 2001, now U.S. Pat. No. 6,532,172.

Operation of a memory system such as illustrated in FIG. 21 is described in patents and pending applications identified above, and in other patents and pending applications assigned to SanDisk Corporation, assignee of the present application. Those of the cited references that describe the structure, processing or operation of a memory system using floating gates as the storage elements will be recognized as being relevant to implementing the systems using dielectric storage elements in place of the floating gates. In addition, U.S. patent application Ser. No. 09/793,370, filed Feb. 26, 2001, now U.S. Pat. No. 6,738,289, describes a data programming method applied to either floating gate or dielectric storage element systems, which application is incorporated herein by this reference.

Fourth Memory Cell Example

A fourth example, illustrated in FIGS. 22-24, applies the dielectric storage techniques to a NAND array, the floating gate version of which is generally described in the Background above. Conductive word lines 241-244, elongated in the x-direction and spaced apart in the y-direction, extend across strips 245-249 of charge storage dielectric and intermediate isolation regions 251-254 formed of dielectric in trenches of the semi-conductor substrate 257, as best seen in the cross-section of FIG. 23A. The dielectric strips 245-249 are elongated in the y-direction and spaced apart in the x-direction with one of the dielectric isolation regions 251-254 positioned therebetween. The dielectric regions 251-254 are preferably formed by typical shallow trench isolation (STI) techniques. Alternative techniques for providing electrical isolation between adjacent columns of memory cells may be used instead.

The dielectric strips 245-249 are formed directly on the surface of the substrate 257. The dielectric material and other characteristics are preferably those of one of the two described above with respect to FIGS. 6A and 6B. The word lines 241-244 are, in turn, positioned directly on top of these dielectric strips in regions that become charge storage regions. Charge storage regions 265-267 are indicated in FIG. 23A along the word line 242, and regions 269, 265, 271 and 272 in FIG. 23B along the dielectric strip 246. Doped source and drain regions are formed in surface areas of the substrate 257 between the word lines and the isolation dielectric. For example, source and drain regions 261-263 are positioned in between word lines of a column formed between dielectric isolation regions 251 and 252. This column forms one string of series connected memory cells, as shown in the cross-sectional view of FIG. 23B and represented by an electrical equivalent circuit diagram in FIG. 24. At each end of the string is a switching select transistor, shown in FIG. 23B at one end to have a gate 275 and at the other end to have a gate 277. Terminals 279 and 281 form electrical ends of the string of storage and select transistors. One of these terminals is usually connected to an individual bit line and the other to a common potential. There are a very large number of such transistor column strings, arranged in columns extending in the y-direction, in a typical memory cell array.

FIGS. 22-23B illustrate the use of dielectric charge storage material in one specific NAND memory cell array structure. It will be recognized that dielectric charge storage material may also serve as charge storage elements in other specific NAND array structures.

Typically in existing NAND arrays of memory cells with conductive floating gate storage elements, a group of memory cells, one cell in each of several such column strings that is in a selected common row, are selected for simultaneous reading or programming. The row is selected by placing appropriate voltages on the word lines. During a reading operation, the word lines of the rows within the associated NAND strings are raised to a relatively high voltage in order to render the memory cell transistors in those rows along each of the involved strings highly conductive, with the exception of the one row of cells that is desired to be read. During a programming operation, the voltage of the word line of the selected row in the associated NAND strings is raised to a higher voltage compared with the word lines of the non-selected rows of the associated NAND strings. Likewise, the select transistors at the ends of the strings of selected columns of cells are appropriately biased and appropriate voltages applied to their end terminals in order to carry out the desired reading or programming function. The same procedure can be applied to a NAND array of memory cells with dielectric storage media, such as that of FIGS. 22-24.

As with the other examples previously described, charge stored in the dielectric of a memory cell affects the threshold voltage of that cell. For example, the level of charge stored in the region 265 of the dielectric strip 246 establishes the threshold voltage level of the memory cell transistor formed by that region, the adjacent source and drain regions 261 and 262, a portion of the substrate between the source and drain that forms the cell's channel, and a portion of the word line 242 positioned over the channel. Each of the memory cell charge storage regions may be operated in two states or in more than two states, as previously described above for the other examples.

One process for forming the NAND structure illustrated in FIGS. 22-23B includes first forming a layer of the charge storage dielectric material such as ONO over the entire area of the substrate to be occupied by the array. A mask of silicon nitride material is formed on top of the ONO layer to define parallel, elongated trenches in the substrate used to isolate adjacent NAND strings. An etching step then removes the dielectric layer and forms trenches in the substrate through openings of the mask. Silicon oxide is then deposited over the structure to fill in the trenches and openings of the mask. Excess oxide is removed, followed by removal of the silicon nitride mask material. The result is the structure shown in FIGS. 23A and 23B without the word lines (WLs). The word lines are then formed by depositing a layer of doped polysilicon material over at least the array area and then etching away portions of the material through another mask in order to leave the word lines as shown in FIGS. 23A and 23B. An ion implant can then be made through the charge storage dielectric layer into regions of the substrate that remain exposed between the thick isolation dielectric and the word lines, thereby to form the source and drain regions.

Another process for forming a slightly different NAND dielectric storage array is illustrated by FIGS. 25A, 25B and 25C. These views show the development of the structure along section VII-VII of the plan view of FIG. 22. Reference numbers of elements of FIGS. 25A-25C that correspond to elements of FIGS. 22-23B are the same with a double prime (") added.

In a first series of processing steps illustrated in FIG. 25A, a layer of silicon nitride is deposited on the surface of the substrate 257", usually after growing a thin layer 296 of silicon dioxide on the substrate surface 257". A mask is then formed on the nitride layer with openings elongated in the y-direction (FIG. 22) and the nitride layer is etched away through the mask to leave nitride strips 291-295 that are elongated in the y-direction and spaced apart in the x-direction. The substrate is then etched in the spaces between the nitride strips that serve as a mask, thereby forming isolation trenches in the substrate. Those trenches (FIG. 25B) are then filled with silicon oxide by depositing a thick oxide layer over the structure and then removing it to leave the portions 251", 252", 253" and 254" that fill the substrate trenches and extend slightly above the substrate surface.

A next series of steps is illustrated by FIG. 25C. The nitride strips 291-295 are removed by a selective etch that leaves the trench oxide between them and the substrate surface under them mostly unaffected. A layer 297 of charge storage dielectric, such as ONO, is then formed over the entire memory cell array area, covering the exposed substrate surface areas and the portions of the isolation dielectric extending above the substrate surface. Word lines are then formed by depositing a layer of doped polysilicon material over the entire area, forming a mask on top of the polysilicon layer with openings that are elongated in the x-direction and spaced apart in the y-direction, and then removing the polysilicon though the mask openings. This leaves the word lines extending across the structure, including the word line 242" of FIG. 25C. Source and drain regions of the substrate (not shown in the views of FIGS. 25A-25C) can then be implanted through the charge storage dielectric layer 297 between the word lines and isolation oxide that serve as an implant mask.

It can be noted that the resulting structure of FIG. 25C has its charge storage dielectric layer 297 extending over the entire array area, while that of FIGS. 23A and 23B limits this dielectric layer to strips in between the thick isolation dielectric layers. In either case, a charge storage dielectric layer is provided over the channels of the NAND storage transistors where it is need to store charge.

Yet another process to form a somewhat different NAND array is illustrated in FIGS. 26A-26D. FIGS. 26A-26C show the development of the structure along section VII-VII of the plan view of FIG. 22, while FIG. 26D shows the intermediate structure of FIG. 26C along the orthogonal section VIII-VIII. A principal difference in the process of FIGS. 26A-26D is the formation of a substrate etch mask with strips of polysilicon instead of nitride, portions of those strips in areas of the memory cells then being retained as part of the word lines. Also, the resulting charge storage dielectric layer is not continuous over the entire memory cell array. Reference numbers of elements that correspond to those of FIGS. 22-25C are the same in FIGS. 26A-26D, with a triple prime ("') included.

A first series of processing steps illustrated in FIG. 26A. A layer 469 of charge trapping dielectric, such as ONO, is formed on the surface of the silicon substrate 257"'. A layer of doped polysilicon is then deposited on the dielectric layer 469 over the area of the memory cell array. Next, a layer of silicon nitride is deposited on the polysilicon. A mask is then formed to etch openings in the nitride and polysilicon layers that are elongated in the y-direction (FIG. 22). This etching is then performed. As shown in FIG. 26A, this leaves polysilicon strips 471-475 topped with nitride 477 that are elongated in the y-direction and spaced apart in the x-direction.

As shown in FIG. 26B, a next step is to etch the dielectric layer 469 and the substrate 257''' in spaces between the polysilicon/nitride strips that serve as a mask, thereby forming isolation trenches in the substrate. These trenches are then filled with silicon oxide by depositing a thick oxide layer that extends into the trenches through spaces between the polysilicon/nitride strips and over them. This oxide is then removed by CMP down to the nitride layer 477, thereby to leave oxide portions 251''', 252''', 253''' and 254''' that fill the substrate trenches and up to the top of the remaining nitride 477.

A next series of steps is illustrated by FIG. 26C. The nitride 477 is first removed by a selective etch that leaves tops of the polysilicon strips 471-475 exposed. A second layer of doped polysilicon is then deposited over the array structure, making direct contact with the exposed top surfaces of the polysilicon strips 471-475 and portions of the oxide strips 251'''-254''' that rise above the polysilicon strips. Word lines 241'''-244''' are formed as a result, as best shown by FIG. 26D, by etching this second polysilicon layer into strips 481-484 that are elongated in the x-direction and spaced apart in the y-direction. This etching step also removes portions of the polysilicon strips 471-475 in spaces between the strips 481-484, thereby leaving separated portions 471'-474' of these strips connected by the overlying strips 481-484 from the second polysilicon layer. Source and drain regions, such as regions 261'''-263''' (FIG. 26D), are then implanted into the substrate 257''' through the charge storage dielectric in the spaces between the word lines 241'''-244'''.

Fifth Memory Cell Example

Another NAND array is illustrated in FIGS. 27 and 28. The structure of this fifth example differs from the fourth example primarily by eliminating the source and drain diffusions along the NAND memory cell strings between word lines and adding another set of word lines at those positions. This results in nearly doubling the number of independently addressable dielectric charge storage regions along NAND strings of the same length, in the y-direction across the array, using a process having the same minimum resolvable element size. The number of word lines, and thus the number of independently programmable dielectric charge storage regions in individual NAND strings, are more than two and can still be 8, 16, 32 or more but in about one-half the length of conventional NAND strings having the same number of charge storage regions.

FIG. 27 is a plan view of a small part of the fifth example array, and FIG. 28 shows a cross-section through one of its memory cell strings and the select transistors at each end of this string. The array is formed on a semiconductor substrate 301 having a surface 303. A plurality of charge storing dielectric strips 305-309 are elongated in the y-direction across the array and spaced apart in the x-direction between deep oxide isolation regions 311-314 that are also elongated in the y-direction. The isolation regions 311-314 can be essentially the same as the regions 251-254 (FIG. 23A) or 251''-254'' (FIG. 25C) of the fourth example. The charge storing dielectric strips 305-309 may be physically separated in the x-direction between the oxide isolation regions, similar to what is shown in FIG. 23A for the fourth example, or may be part of a continuous dielectric layer that extends over the oxide isolation regions, as shown in FIG. 25C. A section IX-IX across FIG. 27, although not specifically shown, can be essentially the same as one of those two figures. These features of the fourth and fifth examples can be the same.

What is primarily different between the two, however, is the configuration of word lines 317-323, elongated in the x-direction as before but packed in the y-direction immediately adjacent each other with a suitable dielectric therebetween. The word lines are not separated by the memory cell source and drain regions, as they are in the fourth example above. Indeed, with the word lines being positioned alongside each other in the y-direction, the source and drain regions are not required. These regions are not directly connected to an external voltage in the fourth example but rather provide a conductive path along those intervals of each NAND string between charge storage elements. The word lines and charge storage regions under them together control the conduction of the substrate channel under them. The substitution in this fifth example of additional word lines in place of the source and drain regions results in the word lines and charge storage regions under them controlling the conductivity of the substrate channel where the source and drain regions exist in the fourth example above. And the density of charge storage regions along the dielectric strips doubles, as illustrated by charge storage regions 327-333 in one NAND string of FIGS. 27 and 28.

With reference to FIG. 28, an external connection of a memory cell string includes source and drain diffusions 341 and 343 at opposite ends of the string that are respectively connected to a global bit line (not shown) and a common potential such as ground at respective terminals 345 and 347. That connection is enabled by voltages GC0 and GC1 applied to respective control gates 349 and 351 at opposite ends of the string. The control gates 349 and 351 are preferably positioned immediately adjacent to word lines 353 and 355 that are at the ends of the string.

One processing technique for forming the structure generally illustrated by FIGS. 27 and 28 is explained with respect to the cross sectional views of FIGS. 29A and 29B. The starting point can be one of the alternative structures of the fourth example that are illustrated in FIG. 23A or FIG. 25C but with the source and drain implants omitted. At that stage, word lines 317, 319, 321 and 323 are in place over continuous charge storage dielectric strips 305-309 but a first additional step is to remove the dielectric from the substrate surface 303 in between the word lines so that a new dielectric layer 361, preferably ONO, may be formed over all the structure. The layer 361 then serves as the charge storage dielectric under additional word lines to be formed and provides a dielectric layer between those additional word lines and the existing word lines 317, 319, 321 and 323.

A next step is to deposit a doped polysilicon layer 365, or other suitable conductive material, on top of the dielectric layer 361 and in conformance with it over the entire array area. A mask for etching the polysilicon layer 365 is then formed on top of it. In making this mask, parallel strips 367 of an oxide or nitride dielectric may first be formed with lengths extending in the x-direction and spaced apart in the y-direction to cover portions of the polysilicon layer 365 between word lines 317, 319, 321 and 323. The dielectric strips 367 are preferably formed by depositing a layer of dielectric over the entire polysilicon layer 365 and then etching that layer into the strips 367 by use of a photoresist mask on top of the oxide layer. Next, spacers 369 of an oxide are formed along edges of the strips 367 to narrow the spaces between them. A standard method of forming the spacers 369 is to deposit another layer of dielectric over the dielectric strips 367 and then anisotropically etching this other layer away to leave the spacers 369.

A next step is to etch the polysilicon layer 365 through the mask 367, 369, leaving word lines 318, 320 and 322 positioned between the word lines 317, 319, 321 and 323 in the y-direction, as shown in FIG. 29B. The dielectric mask 367, 369 can then be removed, as shown, but it is not always necessary to do so. Since the photoresist mask used to form the masking dielectric strips 367 is not self-aligned with the word lines 317, 319, 321 and 323 in the y-direction, the spaces between the dielectric strips 367 are made smaller than the minimum lithographically resolvable dimension of the process by use of the spacers 369. But even with a small misalignment of the photoresist mask as will occasionally occur, the resulting word lines 318, 320 and 322 will completely fill the spaces between adjacent ones of the world lines 317, 319, 321 and 323 as covered by the dielectric layer 361. This is because the word lines 318, 320 and 322 are individually made to be wider in the y-direction than necessary to fill the spaces between word lines 317, 319, 321 and 323 if perfect alignment could be assured.

An alternate technique for forming the additional word lines is illustrated by FIGS. 30A and 30B. Several steps occur before depositing a second layer 371 of doped polysilicon. The polysilicon word lines 317, 319, 321 and 323 are each covered by oxide layer strips 373, which in turn are covered by nitride strips 375. The strips 373 and 375 are preferably formed by covering the entire first polysilicon layer with these two layers before etching into the individual word lines 317, 319, 321 and 323. All three layers (the polysilicon, oxide and nitride) are then etched together to result in the multi-word line strips illustrated in FIG. 30A. A layer 373 of dielectric such as ONO is then formed to conform to exposed surfaces over the array area. It is over the dielectric layer 377 that the second layer 371 of doped polysilicon is deposited.

The second polysilicon layer 371 is made thick enough to completely fill the spaces between the word lines 317, 319, 321 and 323. Excess polysilicon is then removed by a chemical-mechanical-polishing (CMP) step that uses the nitride strips 375 as stops. The result is the additional word lines 318, 321 and 322, as shown in FIG. 30B. In addition to the CMP step, an etching step may be subsequently performed to make sure the polysilicon strips 318, 321 and 322 are completely isolated electrically from one another, and this can result in the thickness of these strips being reduced somewhat.

Memory System Utilizing an Array of the Fourth or the Fifth Example Memory Cells Another example memory system in which the various aspects of the present invention may be implemented is illustrated by the block diagram of FIG. 31. Memory cell array 1 including a plurality of memory cells arranged in a matrix is controlled by a column control circuit 2, a row control circuit 3, a c-source control circuit 4 and a c-p-well control circuit 5. This system is particularly suited to use a memory cell array 1 that is of the NAND type of the fourth and fifth examples described above.

A control circuit 2 is connected to bit lines (BL) of the memory cell array 1 for reading data stored in the memory cells, for establishing a state of the memory cells during a program operation, and for controlling potential levels of the bit lines (BL) to promote the programming or to inhibit the programming. One terminal of each string of NAND memory cells described above, for example, can be connected to one of the bit lines, and the other terminal of the string to a common potential such as ground. The row control circuit 3 is connected to word lines (WL) to apply reading or programming voltages to the word lines. These voltages, combined with the bit line potential levels controlled by the column control circuit 2, cause selected memory cells along one of the word lines to be read or programmed in parallel. An erase voltage is also applied by the circuits 2 to a p-type region on which the memory cells are formed. The c-source control circuit 4 controls a common source line (labeled as "c-source" in FIG. 31) connected to the memory cells. The c-p-well control circuit 5 controls the c-p-well voltage.

The data stored in the memory cells are read out by the column control circuit 2 and are output to external I/O lines 51 via internal I/O lines 53 and a data input/output buffer 6. Program data to be stored in the memory cells are input to the data input/output buffer 6 via the external I/O lines 51, and transferred to the column control circuit 2. The external I/O lines 51 are connected to a controller 43. The controller includes various types of registers and other memory including a volatile random-access-memory (RAM) 45.

Command data for controlling the flash memory device are inputted to command circuits 7 through internal control lines 55 through external control lines 57 that are connected with the controller 43. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 can output a status data of the flash memory such as READY/BUSY or PASS/FAIL.

The controller 43 is connected to, or connectable with, a host system such as a personal computer, a digital camera, or a personal digital assistant. It is the host that initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. A typical memory system includes one integrated circuit chip 47 that includes the controller 43, and one or more integrated circuit chips 49 that each contain a memory array and associated control, input/output and state machine circuits. The trend, of course, is to integrate the memory array and controller circuits of a system together on one or more integrated circuit chips.

Either of the memory systems of FIG. 21 or FIG. 31 may be embedded as part of the host system, or may be included in a memory card that is removably insertable into a mating socket of a host system. Such a card may include the entire memory system. Alternatively, the controller and memory array (with associated peripheral circuits) may be provided in separate cards. Several card implementations are described, for example, in U.S. Pat. No. 5,887,145, which patent is expressly incorporated herein in its entirety by this reference.

Other Memory Cell Configurations

Other configurations of memory cell arrays that use conductive floating gates may similarly be modified to replace the floating gates with charge trapping dielectric material, and then to operate each charge storage region of the array either in binary (two states) or multi-states (more than two states). For example, certain configurations described in patents and patent applications referenced above position either of the storage elements or source/drain diffusions in trenches, the trenches either being rectangular in cross-section or V-shaped. In these embodiments, the conductive storage elements can also be replaced with charge trapping dielectric material.

Conclusion

Although the various aspects of the present invention have been described with respect to specific examples thereof, it will be understood that the invention is entitled to protection within the full scope of the appended claims.

It is claimed:

1. A non-volatile memory cell transistor structure formed on a semiconductor substrate, comprising:
   a dielectric charge storage element over a channel of the memory cell transistor with one or more limited, contained charge storage regions therein; and
   a control gate extending into a recess in the substrate in the channel with said one or more charge storage regions being positioned in the dielectric charge storage element in the recess between the control gate and the substrate,
   wherein charge in one of more than two detectable levels is stored in each of the one or more charge storage regions, thereby storing more than one bit of data in a single localised charge storage region of the dielectric over a portion of the channel.

2. The non-volatile memory cell transistor structure of claim 1, arranged to program the said charge storage region by Fowler-Nordheim tunneling.

3. The non-volatile memory cell transistor structure of claim 1, comprising a further charge storage region in the dielectric charge storage element between the recess and a source or drain region of the transistor structure, the further charge storage region positioned under a further control gate.

4. The non-volatile memory cell transistor structure of claim 3, arranged to program said further charge storage region by source side injection or hot electron injection.

5. A non-volatile memory of a type including an array of memory cells that individually have a charge storing dielectric positioned between conductive word lines or gate structure and a surface of a substrate within a semi-conducting channel that extends across the surface between source and drain regions, comprising:
   a reading circuit including:
      sources of voltages connectable to at least the word lines or gate structure; and
      sense amplifiers connectable to at least one of the sources and drains of individual addressed memory cells for determining a level of charge stored in non-overlapping regions of the charge storing dielectric and thereby to read more than one bit of the data from individual defined regions of the charge storing dielectric; and
   a programming circuit including:
      sources of voltages connectable to at least the word lines or gate structure and the source and drain regions to supply voltages thereto with magnitudes that cause charge to be injected from the substrate into at least two defined non-overlapping regions of the charge storing dielectric to thereby allow storage of more than one bit of such data therein.

6. The non-volatile memory of claim 5, wherein the charge storing dielectric includes silicon nitride.

7. The non-volatile memory of claim 5, wherein the charge storing dielectric includes silicon rich silicon dioxide.

8. The non-volatile memory of claim 5 wherein the charge is injected to four threshold level ranges.

9. The non-volatile memory of claim 5, wherein the charge is injected to more than four threshold level ranges.

10. The non-volatile memory of claim 5, wherein the individual memory ceils additionally include the charge storing dielectric material extending continuously along the channel at least between the source and drain regions.

11. The non-volatile memory of claim 5, wherein the gate structure includes at least two gates positioned over distinct segments of the channel with the at least two defined non-overlapping regions of the charge storing dielectric thereunder.

12. The non-volatile memory of claim 11, wherein at least one of the regions of the charge storing dielectric is positioned under each of the at least two gates.

13. The non-volatile memory of claim 11, wherein the at least two gates include at least two gates formed from conductive lines having lengths extending in a direction perpendicular to the channel.

14. The non-volatile memory of claim 11, wherein the at least two gates include at least one gate formed from a conductive line having a length extending in a direction perpendicular to the channel and at least one gate formed from a conductive line having a length extending in a direction parallel with the channel.

* * * * *